(12) United States Patent
Ozaki

(10) Patent No.: US 8,294,699 B2
(45) Date of Patent: Oct. 23, 2012

(54) LUMINESCENCE DEVICE, METHOD OF DRIVING LUMINESCENCE DEVICE, AND METHOD OF MANUFACTURING LUMINESCENCE DEVICE

(75) Inventor: Tsuyoshi Ozaki, Fuchu (JP)

(73) Assignee: Casio Computer Co., Ltd., Tokyo (JP)

( * ) Notice: Subject to any disclaimer, the term of this patent is extended or adjusted under 35 U.S.C. 154(b) by 569 days.

(21) Appl. No.: 12/563,505

(22) Filed: Sep. 21, 2009

(65) Prior Publication Data

US 2010/0073358 A1 Mar. 25, 2010

(30) Foreign Application Priority Data

Sep. 22, 2008 (JP) ................................ 2008-243367
Jul. 1, 2009 (JP) ................................ 2009-157185

(51) Int. Cl.
*G09G 5/00* (2006.01)
(52) U.S. Cl. ......... 345/212; 345/204; 345/211; 345/214
(58) Field of Classification Search ........................ None
See application file for complete search history.

(56) References Cited

U.S. PATENT DOCUMENTS

| | | | |
|---|---|---|---|
| 6,633,359 B1 | 10/2003 | Zhang et al. | |
| 7,583,261 B2 | 9/2009 | Shirasaki et al. | |
| 7,696,518 B2 | 4/2010 | Koo | |
| 2006/0202934 A1 * | 9/2006 | Shin et al. | 345/95 |
| 2007/0216613 A1 * | 9/2007 | Ogura et al. | 345/76 |
| 2008/0266214 A1 * | 10/2008 | Naugler et al. | 345/76 |
| 2010/0073358 A1 | 3/2010 | Ozaki | |

FOREIGN PATENT DOCUMENTS

| | | |
|---|---|---|
| JP | 2001-051303 A | 2/2001 |
| JP | 2001-100654 A | 4/2001 |
| JP | 2001-195012 A | 7/2001 |
| JP | 2004-240400 A | 8/2004 |
| JP | 2007-264445 A | 10/2007 |
| JP | 2008-122848 A | 5/2008 |
| JP | 2010-097187 A | 4/2010 |

OTHER PUBLICATIONS

Japanese Office Action dated Sep. 7, 2010 (and English translation thereof) in counterpart Japanese Application No. 2009-157185.
Japanese Office Action dated Apr. 17, 2012 (and English translation thereof) in counterpart Japanese Application No. 2010-248250.

* cited by examiner

*Primary Examiner* — Lixi C Simpson
(74) *Attorney, Agent, or Firm* — Holtz, Holtz, Goodman & Chick, PC

(57) ABSTRACT

A luminescence device according to the present invention includes a plurality of pixels arranged in a row direction and a column direction. Each pixel includes a luminescence driving transistor, a pixel electrode, a luminescence layer formed above the pixel electrode, and an opposing electrode formed above the luminescence layer. Current supply lines La connect the pixels in the row direction and are arranged to extend in the same direction. Adjoining current supply lines La are electrically connected to each other by a drain electrode of the luminescence driving transistor of the pixel positioned between these current supply lines La. Therefore, adjoining current supply lines La are made to be at the same potential.

8 Claims, 30 Drawing Sheets

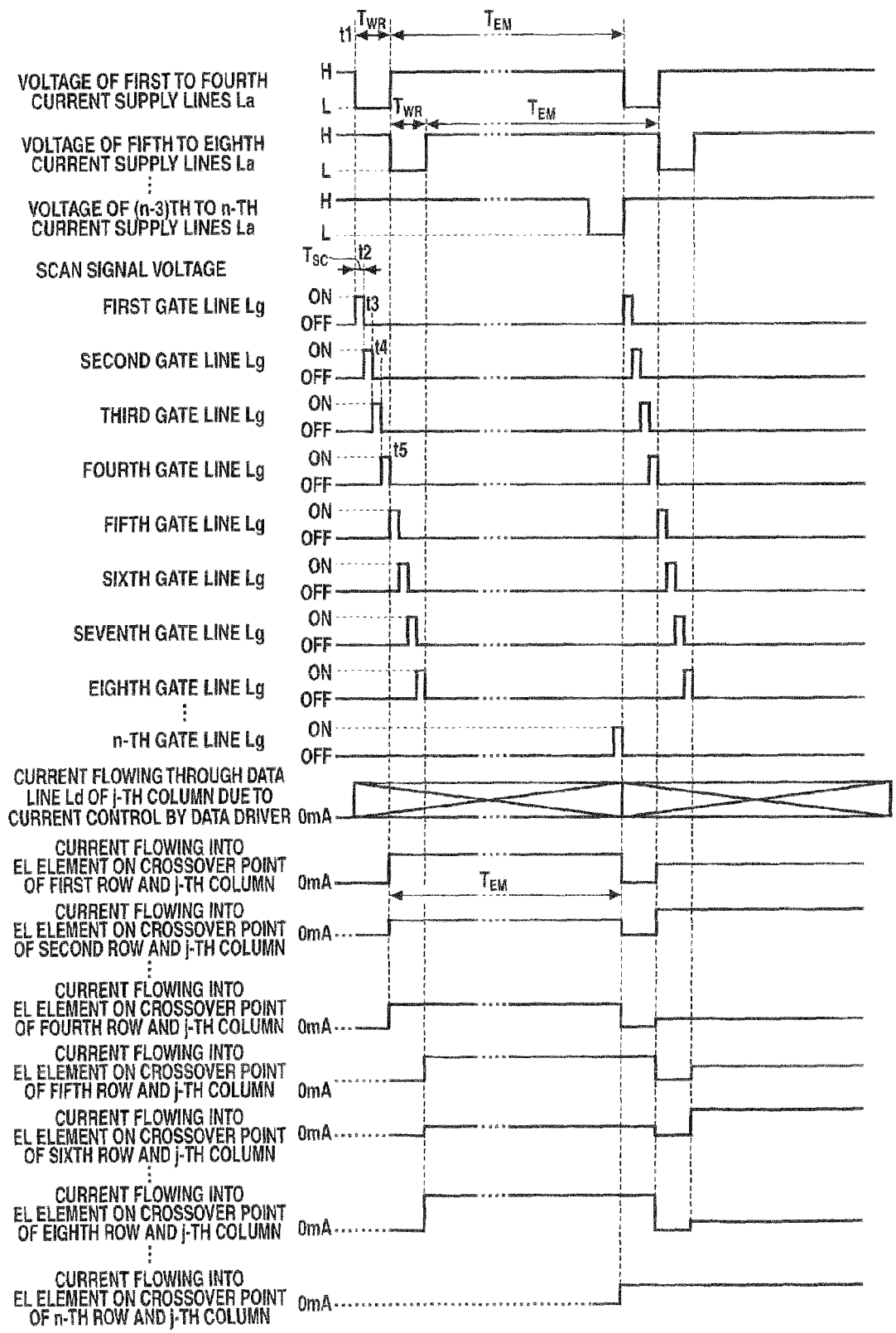

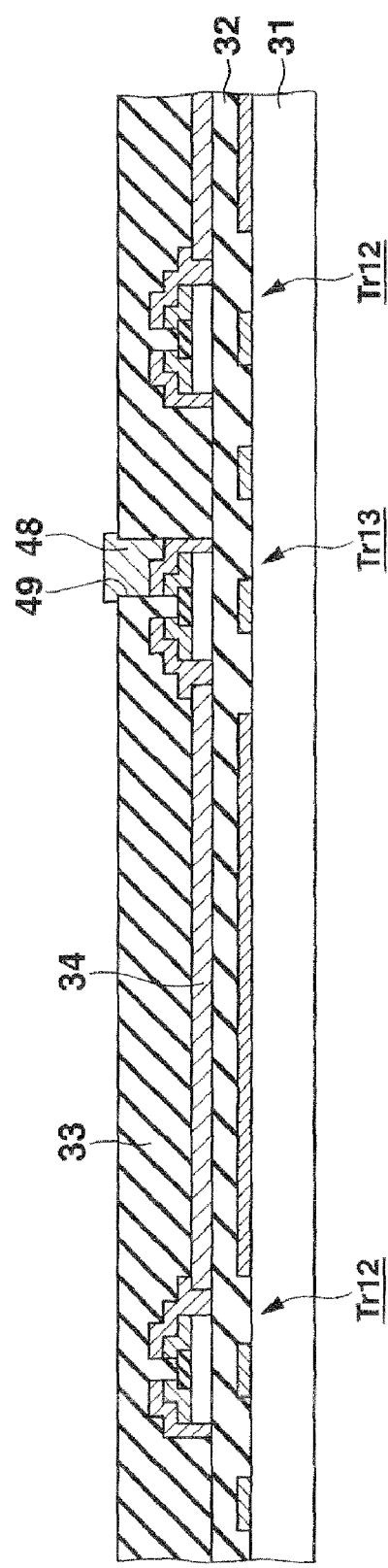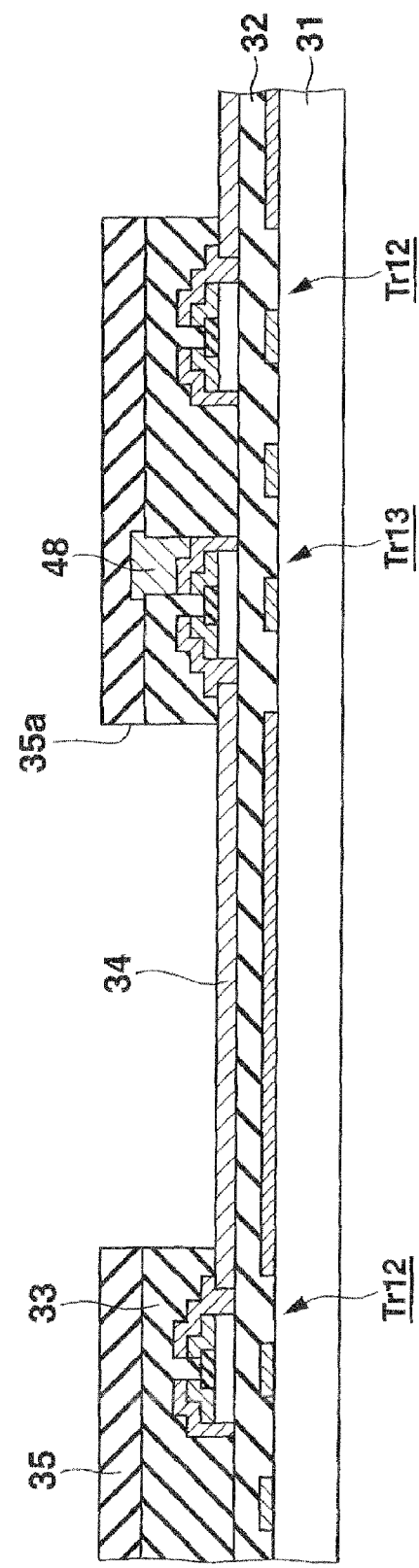

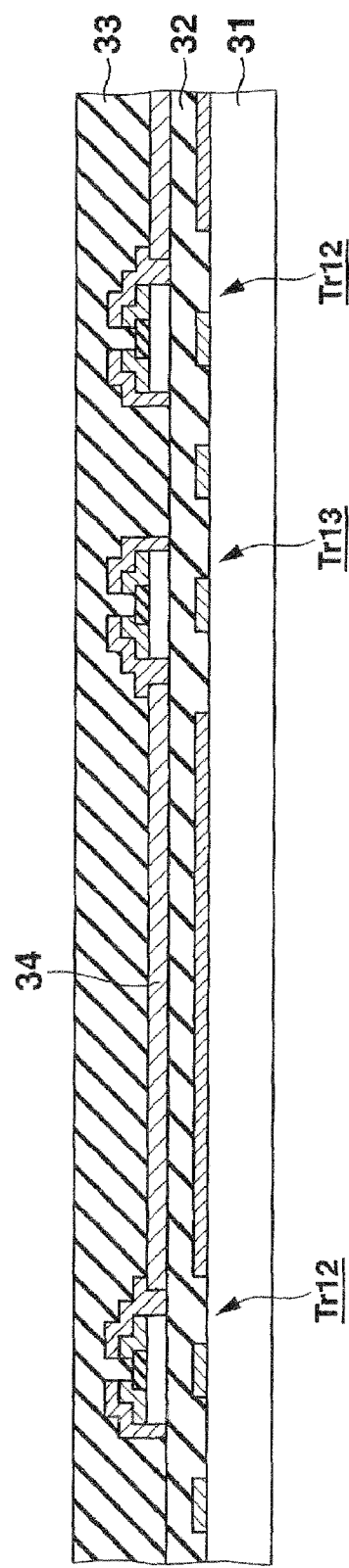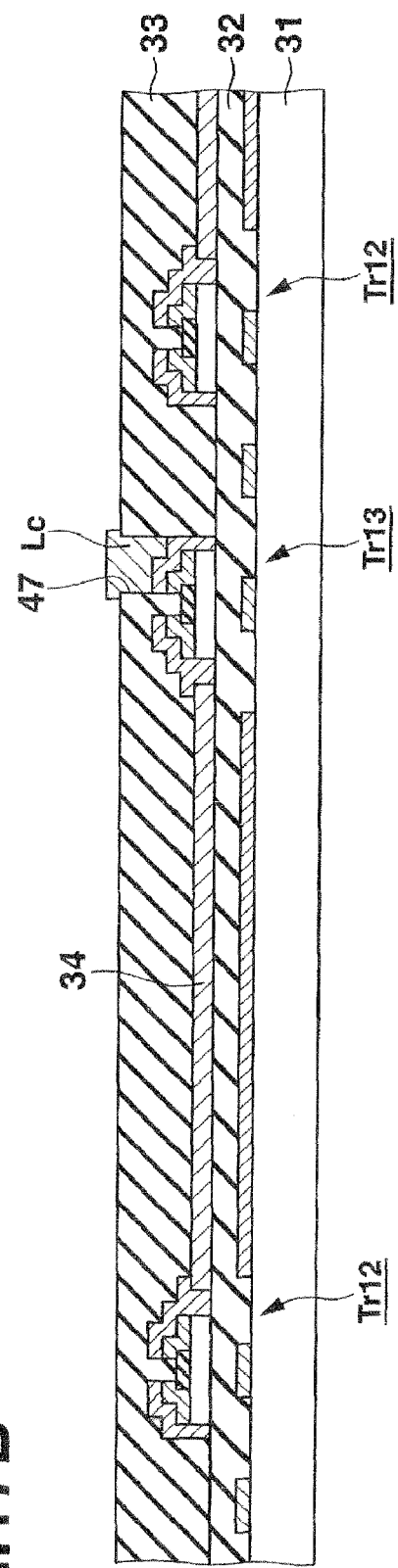

LUMINESCENCE DEVICE, METHOD OF DRIVING LUMINESCENCE DEVICE, AND METHOD OF MANUFACTURING LUMINESCENCE DEVICE

BACKGROUND OF THE INVENTION

1. Field of the Invention

The present invention relates to a luminescence device using an organic electroluminescence (EL) element, a method of driving a luminescence device, and a method of manufacturing a luminescence device.

2. Description of the Related Art

Recently, research and development activities have been flourishing in the field of display devices that have a luminescence element type display panel on which luminescence elements such as organic electroluminescence elements (hereinafter, abbreviated as "organic EL elements") or the like are disposed in a two-dimensional array, in order to put these devices into full-scale practical and wide use as the next-generation display devices that succeed liquid crystal display (LCD) devices.

An organic EL element includes an anode electrode, a cathode electrode, and, for example, an electron injecting layer, a luminescence layer, a positive hole injecting layer, etc. that are deposited between these electrodes. The organic EL element emits light by energy that is generated when positive holes supplied by the positive hole injecting layer and electrons supplied by the electron injecting layer are recombined in the luminescence layer. As disclosed in Unexamined Japanese Patent Application KOKAI Publication No. 2001-195012, such organic EL elements are used in a display device and driven by Thin Film Transistors (TFTs) or the like that are provided in the respective pixels.

In such a display device, a plurality of pixels each including an organic EL element are generally arranged in the row and column directions and form a matrix. In a case where the TFTs in the pixels are selected row by row through a selecting scan line, the plurality of pixels arranged on the same row are connected through a single current supply line (power feeding line) to a voltage source that causes a current to flow into the respective organic EL elements. Therefore, when the plurality of pixels is to emit light at the same time, a current necessarily flows into the plurality of pixels on the same row at the same time through a single current supply line.

Active matrix display devices that designate a gray level by means of a voltage or a current write a display signal that prescribes the amount of light to be emitted by the organic EL elements into elements that drive the respective pixels by making a current matching the display signal flow into the pixels. Therefore, in a case where the total amount of the currents written into the pixels arranged on the same row is large or in a case where the resistance of the current supply line is not sufficiently low, these display devices would suffer from a problem that the potential of the current supply line easily deviates from the reference value. This causes a problem that the potential varies depending on the length of the current supply line between the voltage source and each pixel, i.e., depending on the position of each pixel and hence the voltage written into the each capacitor varies, making it impossible to obtain a desired luminance. This problem is more remarkable in display devices with a larger area. Particularly, when displaying an image such as a moving image that changes its gray level, these display devices often result in displaying an instable image because such an image requires the total amount of the currents written into the plurality of pixels corresponding to each current supply line to greatly change frame by frame.

Hence, there has been a demand for a luminescence device that can suppress a voltage from decreasing along a current supply line, a method of driving a luminescence device, and a method of manufacturing a luminescence device.

The present invention was made in view of the circumstance described above, and an object of the present invention is to provide a luminescence device that can suppress a voltage from decreasing along a current supply line, a method or driving a luminescence device, and a method of manufacturing a luminescence device.

SUMMARY OF THE INVENTION

A luminescence device according to one aspect of the present invention includes:

a plurality of pixels that are arranged in a row direction and a column direction, each pixel including a luminescence element and a luminescence driving transistor connected to the luminescence element, the luminescence element including a first electrode, at least one or more carrier transporting layer(s) formed above the first electrode, and a second electrode formed above the carrier transporting layer(s); and a plurality of current supply lines that are each connected to a east two or more of the pixels that are arranged in the row direction, and at least two or more of the current supply lines that adjoin each other in the column direction are connected to each other between the pixels that adjoin each other or one another in the row direction.

An electrode of the luminescence driving transistor of each pixel may electrically connect the current supply lines that adjoin each other in the column direction to each other.

The electrode of the luminescence driving transistor may elongate in the column direction so as to connect the at least two or more current supply lines that adjoin each other.

The luminescence device may further include a selection signal supply line that supplies a selection signal to the at least two or more pixels that are arranged in the row direction, and the selection signal supply line may be formed above an insulating layer that is formed to cover the electrode of the luminescence driving transistor.

Each of the pixels may further include a selector transistor.

The luminescence driving transistor may be larger than the selector transistor, and have a channel width that extends along the column direction.

A conductive layer may be formed above each of the current supply lines and/or the electrode of the luminescence driving transistor.

The luminescence device may further include a selection signal supply line that supplies a selection signal to the at least two or more pixels that are arranged in the row direction, and a conductive layer may be formed above each of the current supply lines and/or the electrode of the luminescence driving transistor, and the conductive layer may be formed of the same metal layer as that that forms the selection signal supply line.

The luminescence device may further include a column-direction connecting line that connects at least two or more current supply lines that adjoin each other in the column direction.

The luminescence device may further include:

a selection signal supply line that supplies a selection signal to the at least two or more pixels that are arranged in the row direction; and a column-direction connecting line that is formed to connect the at least two or more current supply lines that adjoin each other in the column direction, and the column-direction connecting line may be formed to cross the selection signal supply line via an insulating film.

The luminescence device may further include:

a selection signal supply line that supplies a selection signal to the at least two or more pixels that are arranged in the row direction; and a display signal supply line that supplies a display signal, the selection signal supply line and the display signal supply line may be formed of the same metal layer as each other, and the luminescence device may further include a bypass line that is formed at a region where the selection signal supply line and the display signal supply line cross each other, and that is formed of the same metal layer as that that forms the electrode of the luminescence driving transistor.

A luminescence device according to another aspect of the present invention includes:

a plurality of pixels that are arranged in a row direction and a column direction, each pixel including a luminescence element and a luminescence driving transistor connected to the luminescence element, the luminescence element including a first electrode, at least one or more carrier transporting layer(s) formed above the first electrode, and a second electrode formed above the carrier transporting layer(s);

a plurality of current supply lines that are each connected to at least two or more of the pixels that are arranged in the row direction;

a column-direction connecting line that electrically connects the current supply lines that adjoin each other in the column direction to each other; and a switch that controls electrical continuity and electrical discontinuity of the column-direction connecting line in the column direction.

A method of driving a luminescence device according to another aspect of the present invention is a method of driving a luminescence device that includes:

a plurality of pixels that are arranged in a row direction and a column direction, each pixel including a luminescence element and a luminescence driving transistor connected to the luminescence element, the luminescence element including a first electrode, at least one or more carrier transporting layer(s) formed above the first electrode, and a second electrode formed above the carrier transporting layer(s);

a plurality of current supply lines that are each connected to at least two or more of the pixels that are arranged in the row direction;

a plurality of column-direction connecting lines that each electrically connect the current supply lines that adjoin each other in the column direction to each other; and a plurality of switches that control electrical continuity and electrical discontinuity of the column-direction connecting lines in the column direction, and the method includes switching off at least one of the plurality of switches to make at least two of the current supply lines that adjoin each other in the column direction via the switched-off switch electrically discontinuous from each other.

The method of driving the luminescence device may include:

switching off arbitrary two of the plurality of switches to make the current supply lines that correspond to the pixels existing between the two switches electrically discontinuous from the current supply lines that correspond to the other pixels; and applying a first voltage to the current supply lines that correspond to the pixels existing between the two switches and applying a second voltage different from the first voltage to the current supply lines that correspond to the other pixels.

Each of the plurality of pixels may further include a selector transistor, the plurality of switches may be provided for different rows respectively, and the method of driving the luminescence device may include:

turning on the selector transistors of the pixels on a given row and applying the first voltage to the current supply line of that row; and applying the second voltage to the current supply line of that row in an emission period in which the luminescence elements of the pixels on that row are driven to emit light.

The method of driving the luminescence device may include:

switching off the switch provided for that given row when applying the first voltage to the current supply line of that row;

switching on the switch provided for that row when turning on the selector transistors of the pixels on a row next to that row; and switching off the switch provided for that row when modulating the voltage applied to the current supply line of that row from the first voltage to the second voltage.

The plurality of switches may be provided for different groups of "d" rows respectively such that one switch is provided for "d" rows, where "d" is an integer equal to or greater than 2.

A voltage of the same potential may be applied to the current supply lines of each $\{(p-1)\times d+1\}$th to $(p\times d)$th rows, among the plurality of current supply lines, where "p" is a positive integer.

Each of the plurality of pixels may further include a selector transistor, and the method of driving the luminescence device may include controlling each such switch, among the plurality of switches, that is provided for the column-direction connecting line between the current supply line of a $(p\times d)$th row and the current supply line of a $(p\times d+1)$th row, in a manner that the switch makes the current supply line of the $(p\times d)$th row and the current supply line of the $(p\times d+1)$th row electrically discontinuous from each other in scan periods of the selector transistors of the respective pixels on a $\{(p-1)\times d+1\}$th to the $(p\times d)$th rows and in scan periods of the selector transistors of the respective pixels on the $(p\times d+1)$th to a $\{(p+1)\times d\}$th rows, and in a manner that the switch makes the current supply line of the $(p\times d)$th row and the current supply line of the $(p\times d+1)$th row electrically continuous to each other in the other periods than those scan periods.

A method of manufacturing a luminescence device according to another aspect of the present invention includes:

a pixel forming step of forming pixels by arranging them in a row direction and a column direction, each pixel including a luminescence driving transistor, a first electrode, at least one or more carrier transporting layer(s) formed above the first electrode, and a second electrode foisted above the carrier transporting layer(s), the at least one or more carrier transporting layer(s) including a luminescence layer; and a current supply line forming step of forming a plurality of current supply lines by arranging them to extend in a same direction such that each current supply line connects the pixels in the row direction, where the current supply lines are formed such that adjoining ones of them are electrically connected to each other by an electrode of the luminescence driving transistor of the pixel that is arranged between the adjoining current supply lines.

BRIEF DESCRIPTION OF THE DRAWINGS

These objects and other objects and advantages of the present invention will become more apparent upon reading of the following detailed description and the accompanying drawings in which:

FIG. 6 are equivalent circuit diagrams showing a circuit configuration and a driving principle of a pixel, where

FIG. 7 is a timing chart showing an operation;

FIGS. 9A and 9B are diagrams showing the method of manufacturing the luminescence device according to the embodiment 1;

FIGS. 17A and 17B are diagrams showing a method of manufacturing the luminescence device according to the embodiment 2;

DETAILED DESCRIPTION OF THE PREFERRED EMBODIMENTS

A luminescence device and a method of manufacturing, a luminescence device according to the embodiments of the present invention will be explained with reference to the drawings. As an example, the embodiments below will be explained as an active drive type luminescence device that uses bottom emission type organic electroluminescence (EL) elements that emit light to the outside through a substrate above which they are formed.

Embodiment 1

A luminescence device and a method of manufacturing a luminescence device according to the embodiment 1 will be explained with reference to the drawings.

Figure 1:
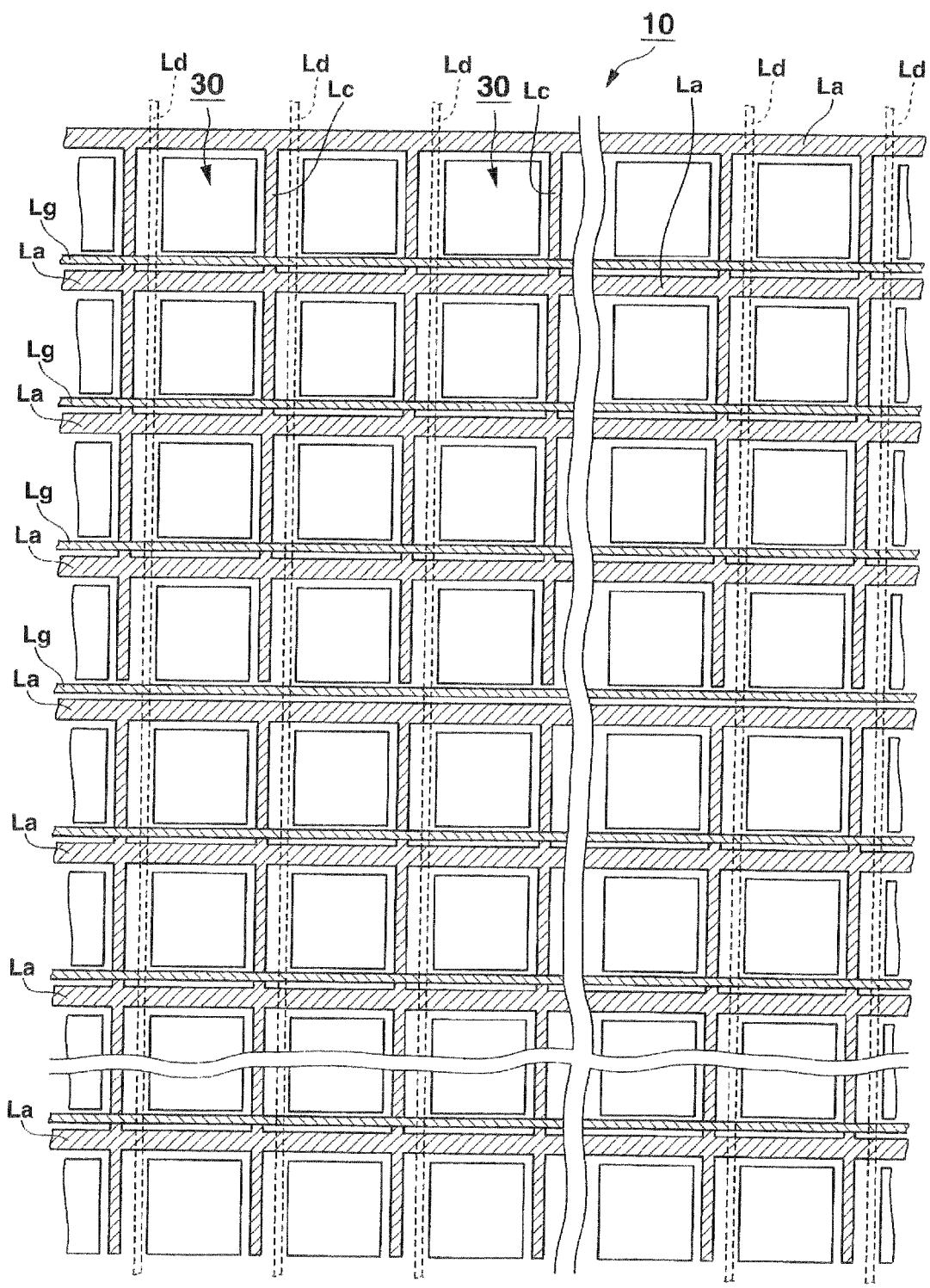
FIG. 1 is a plan view showing an example configuration of a luminescence device according to an embodiment 1.
Figure 2:
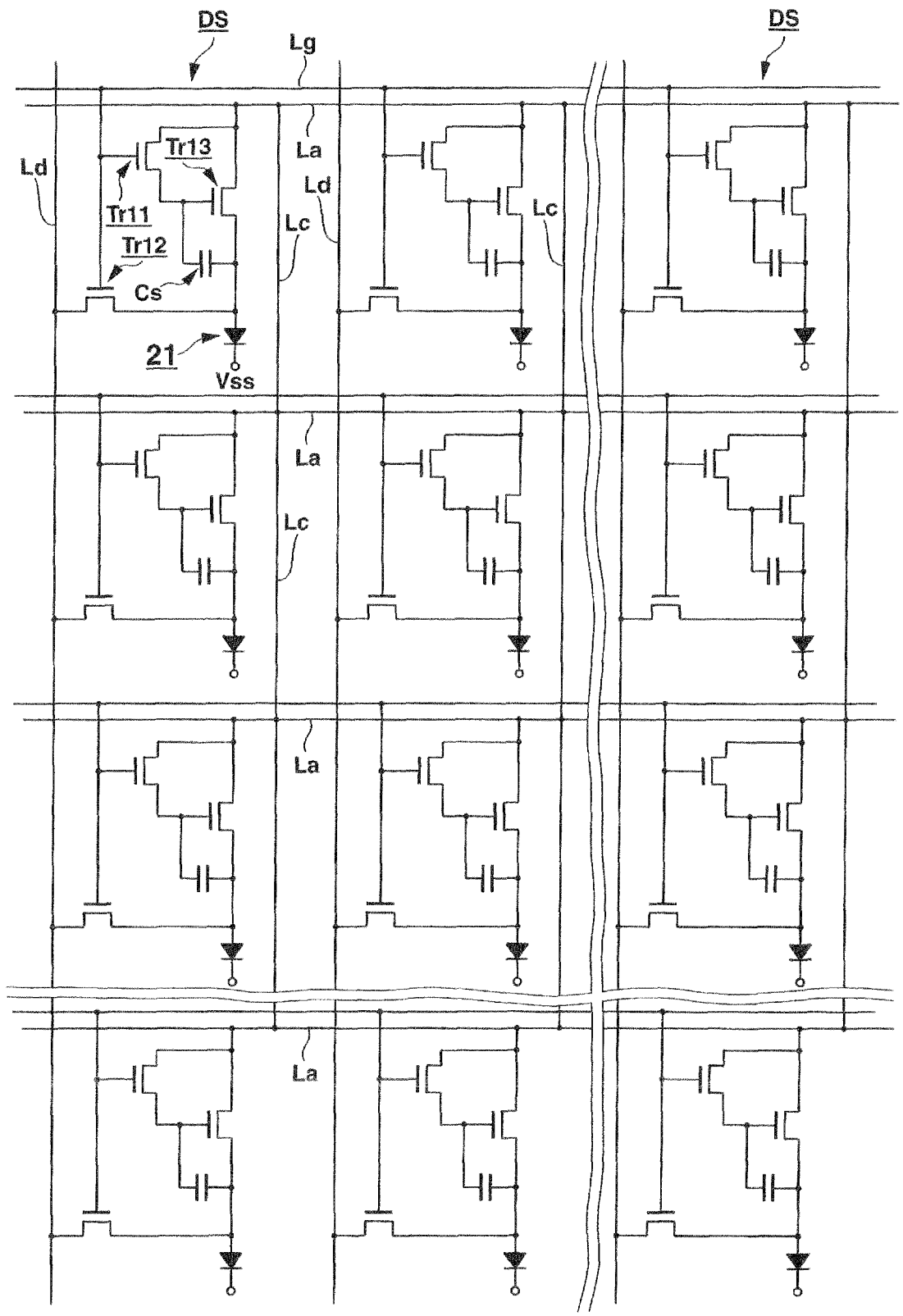
FIG. 2 is an equivalent circuit diagram of a drive circuit of a pixel.
Figure 3:
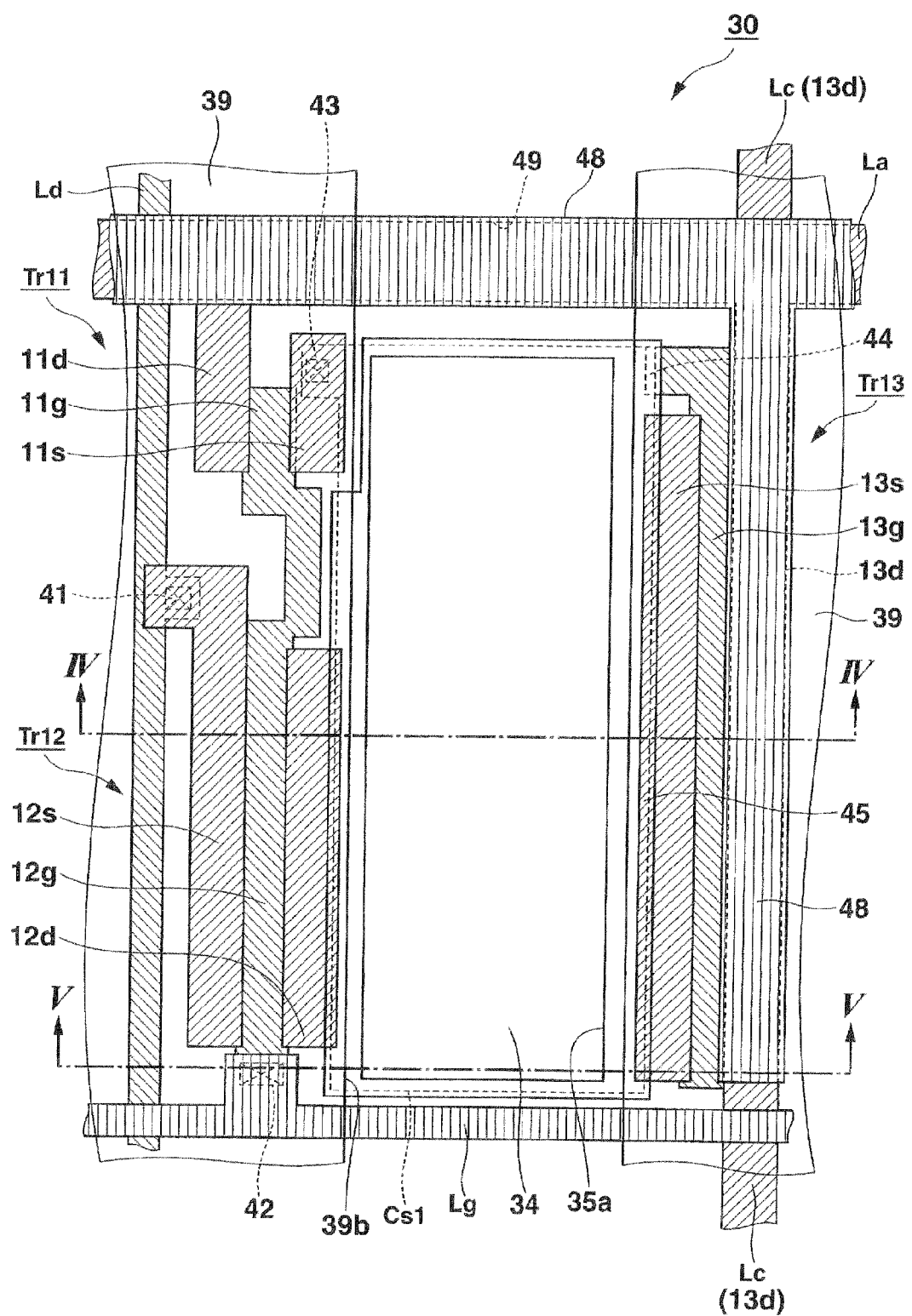
FIG. 3 is a plan view of a pixel.
Figure 4:
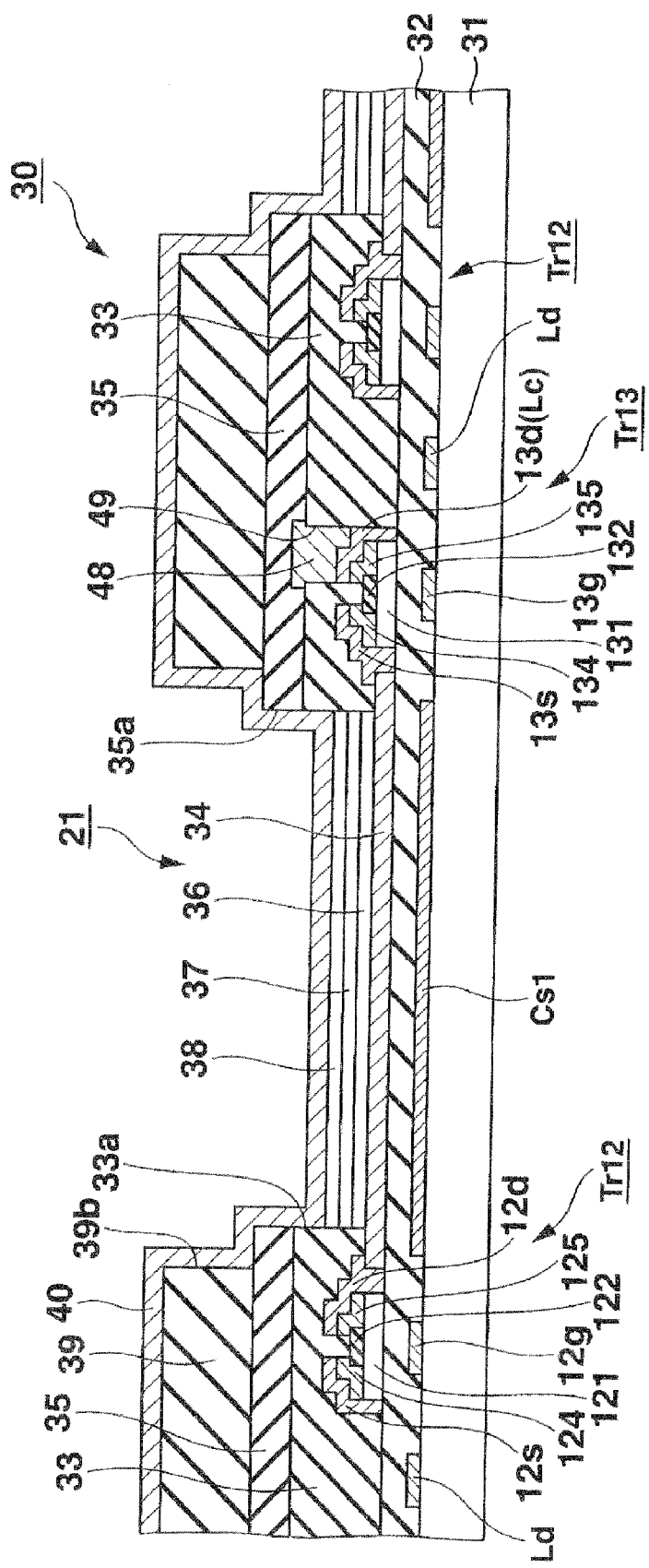
FIG. 4 is a cross section of FIG. 3 taken along a line IV-IV.
Figure 5:
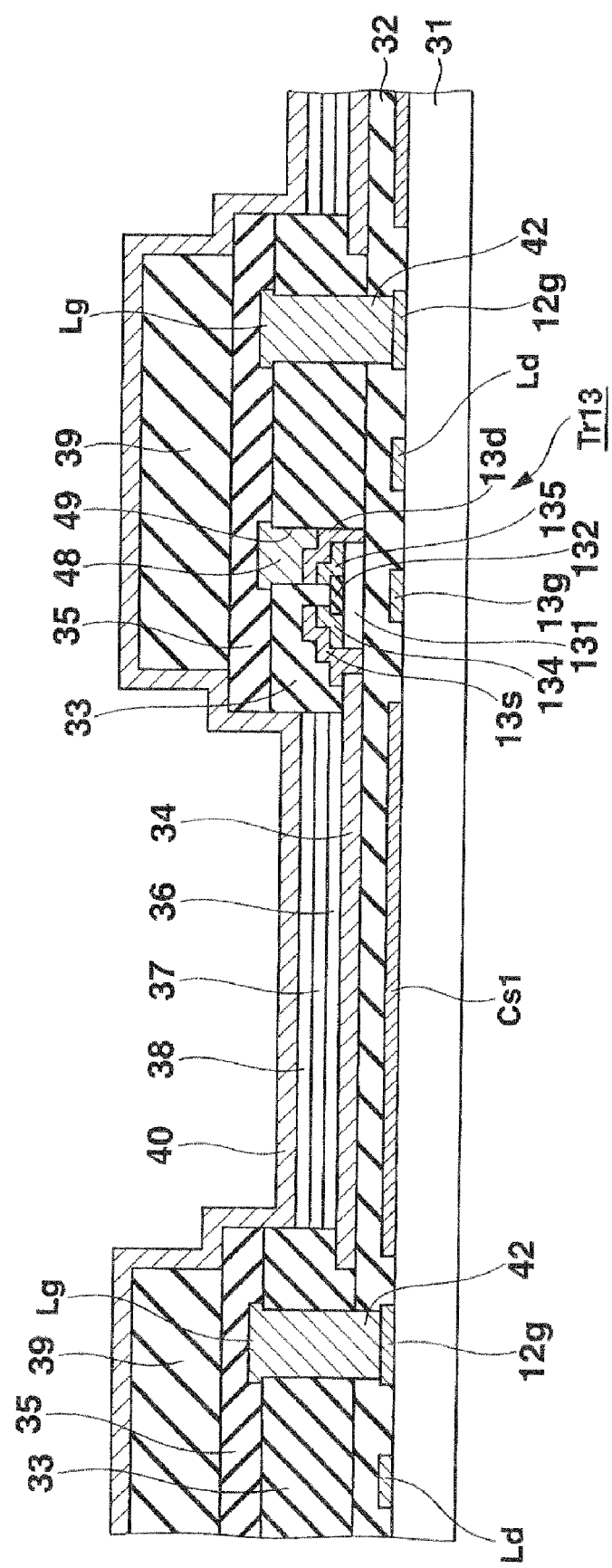
FIG. 5 is a cross section of FIG. 3 taken along a line V-V.
Figure 6A:
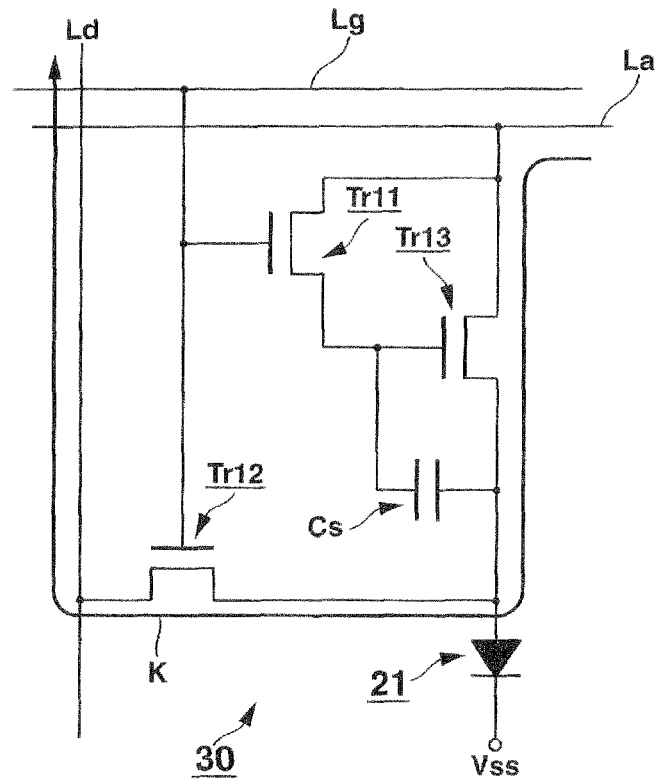
FIG. 6A shows a flow of a current in a scan period $T_{SC}$.
Figure 6B:
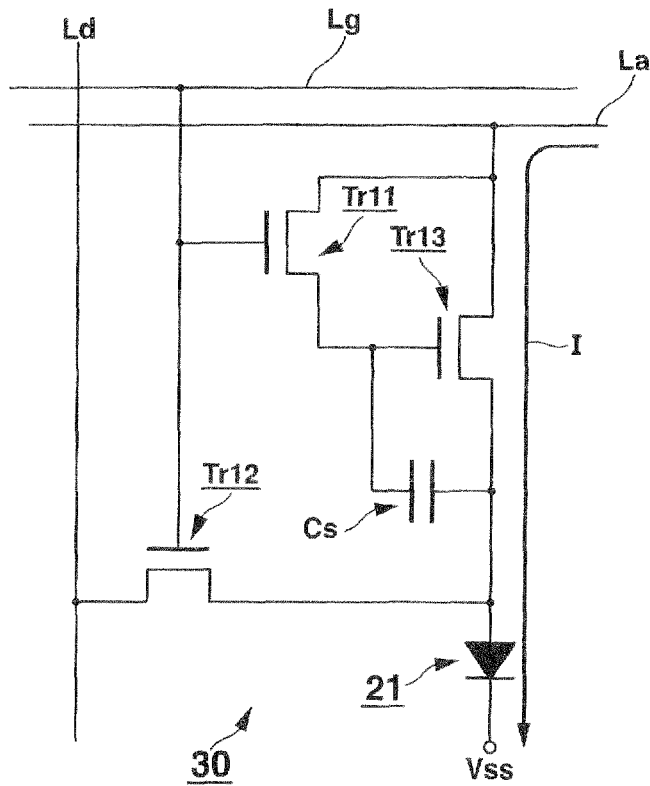
FIG. 6B shows a flow of a current in a group emission voltage period.

FIG. 1 is a diagram showing an example configuration of a display device as a luminescence device according to the embodiment 1. FIG. 2 is an equivalent circuit diagram of a drive circuit that drives the pixels of the luminescence device. FIG. 3 is a plan view of a pixel. FIG. 4 is a cross section of FIG. 3 taken along a line IV-IV. FIG. 5 is a cross section of FIG. 3 taken along a line V-V. FIGS. 6A and 6B are diagrams explaining a writing operation and a light emitting operation of a pixel. FIG. 7 is a timing chart.

As shown in FIG. 1, a luminescence device 10 includes a pixel substrate 31 (see FIG. 4), on which a plurality of, for example, "m" pixel groups each including three pixels 30 that emit light in three colors of red (R), green (G), and blue (B) respectively are arranged repeatedly in the row direction (the left-right direction of FIG. 1), and a plurality of, for example, "n" pixels that emit light in the same color as one another are arranged in the column direction (the up-down direction of FIG. 1). Therefore, m×n pixels that emit the same one of the colors R, G, and B as one another are arranged in a matrix. Each pixel 30 includes an organic EL element (luminescence element) 21 that emits light in R. G, or B, and a pixel circuit DS that switches the organic EL element 21 into active operation. The three kinds of pixels 30 that emit red (R), green (G), and blue (B) may also be disposed in a delta arrangement.

As shown in FIG. 2, the pixel circuit DS includes a first selector transistor Tr11, a second selector transistor Tr12, a luminescence driving transistor Tr13, a capacitor Cs, and an organic EL element 21. The first selector transistor Tr11, the second selector transistor Tr12, and the luminescence driving transistor Tr13 are inversely-staggered n-channel type Thin Film Transistors (TFTs) that include a semiconductor layer that comprises amorphous silicon.

As shown in FIG. 1 and FIG. 2, the luminescence device 10 includes: a plurality of current supply lines (anode lines) La that are each connected to a plurality of pixel circuits DS disposed in a given row; an opposing electrode (second electrode) 40 that is a cathode formed of a single electrode layer opposing to all the pixels in common and to which a voltage Vss, which may be a ground potential, is applied; data lines Ld that are each connected to a plurality of pixel circuits DS disposed in a given column; a plurality of gate lines Lg that each select the first selector transistors Tr11 and the second selector transistors Tr12 of a plurality of pixel circuits DS disposed in a given row; and column-direction connecting lines Lc that each electrically connect the plurality of current supply lines La to each other or one another beyond the pixels. The current supply lines La are connected to an unillustrated power supply or current supply driver. As will be described in detail with reference to FIG. 7, the power supply or the current supply driver modulates the voltage applied to each unit group of a plurality of current supply lines La to a low level L and a high level H alternately such that the former is applied in a scan period $T_{SC}$ and the latter is applied in an emission period $T_{EM}$. Further, as will be described in detail later, the current supply lines La and the column-direction connecting lines Lc are formed of a source-drain conductive layer that forms the source electrodes and the drain electrodes of the transistors Tr11 to Tr13, at the same time as the source electrodes and the drain electrodes are formed. The data lines Ld are formed of a gate conductive layer that forms the gate electrodes of the transistors Tr11 to Tr13, at the same time as the gate electrodes are formed. The gate lines Lg are formed of a third metal layer that is formed above the source-drain conductive layer. The lines formed on these different layers and the electrodes of the transistors are connected to each other via contact portions 41 to 44 formed in an insulating film 32.

As shown in FIG. 1 to FIG. 5, the gate electrode 11g of the first selector transistor Tr11 is connected to the gate line Lg via the contact portion 42, which is a contact hole formed in the insulating film 32, and via the gate electrode 12g of the second selector transistor Tr12. The current supply line La is stacked on the drain electrode 11d of the first selector transistor Tr11 and hence connected to the drain electrode 11d. The source electrode 11s of the first selector transistor Tr11 is connected to a capacitor electrode Cs1 via the contact portion 43, which is a contact hole formed in the insulating film 32.

The drain electrode 12d of the second selector transistor Tr12 is connected to the source electrode 13s of the luminescence driving transistor Tr13 via a pixel electrode (first electrode) 34. The source electrode 12s of the second selector transistor Tr12 is connected to the data line Ld via the contact portion 41, which is a contact hole formed in the insulating film 32. The gate electrode 12g of the second selector transistor Tr12 is connected to the gate line Lg via the contact portion 42.

The drain electrode 13d of the luminescence driving transistor Tr13 is connected to the current supply line La. The gate electrode 13g of the luminescence driving transistor Tr13 is connected to the capacitor electrode Cs1 via the contact portion 44, and further to the source electrode 11s of the first selector transistor Tr11 via the capacitor electrode Cs1. The source electrode 13s of the luminescence driving transistor Tr13 is connected to the pixel electrode 34 by overlapping the pixel electrode 34 at a contact portion 45.

The capacitor Cs is constituted by the capacitor electrode Cs1 as one capacitor electrode, the pixel electrode 34 as the other capacitor electrode, and the insulating film 32 made of silicon nitride or the like, which is a dielectric interposed between the capacitor electrode Cs1 and the pixel electrode 34.

In the present embodiment, as shown in FIG. 1 and FIG. 2, the column-direction connecting lines Lc that electrically connect the plurality of current supply lines La to one another are formed along the column direction of the pixels that is orthogonal to the direction along which the current supply lines La extend. In the present embodiment, as shown in, for example, FIG. 1, one column-direction connecting line Lc per column is formed in a manner that each line Lc connects the total of four current supply lines La as a unit. For example, in the luminescence device 10 on which m×n pixels are arranged, "m" column-direction connecting lines Lc are formed for each four current supply lines La, and the total number of column-direction connecting lines Lc formed in the luminescence device 10 is m×n/4 (where "n" is an integer multiple of four). Electrically connecting each predetermined unit number of closely located current supply lines La by a column-direction connecting line Lc makes the total wire resistance of the current supply lines La lower, suppressing a decrease of a voltage due to the resistance of each single current supply line La. Therefore, the current supply lines La in each unit can apply a voltage of the same level to their corresponding pixels 30, substantially regardless of the resistance of the current supply lines La across each pixel 30 and the power supply or the current supply driver (unillustrated), i.e., substantially regardless of the position of each pixel 30 in the luminescence device 10, making it possible for a current matching a display signal to flow into the organic EL element 21. If it is possible to achieve a desired degree of suppression of a decrease of a voltage across the current supply lines La, the number of a plurality of current supply lines La that are connected to each other or one another needs not necessarily be four, as long as it is an integer equal to or greater than two. The number of column-direction connecting lines Lc provided for a plurality of current supply lines La that are connected to each other or one another may be arbitrary, as long as it is equal to or greater than one. Hence, the column-direction connecting line Lc may be provided in, for example, every other column or every six columns.

In the present embodiment, as shown in FIG. 3, a conductive layer 48 is formed on the upper surface of the current supply line La or each row and on the upper surface of the drain electrode 13d of the luminescence driving transistor Tr13 of each of the plurality of pixels 30 on that row. The conductive layer 48 is formed on the upper surface of the current supply line La to have a wider width than the current supply line La. The conductive layer 48 is made of a conductive material. Providing the conductive layer 48 can further contribute to lowering the resistance of the current supply line La and suppressing voltage decrease. Particularly, in the present embodiment, as will be described in detail later, the conductive layer 48 is formed at the same time as the gate line Lg is formed from the third metal layer, requiring no additional manufacturing step for lowering the resistance of the current supply line La.

The organic EL element 21 includes the pixel electrode 34, a positive hole injecting layer 36, an interlayer 37, a luminescence layer 38, and the opposing electrode 40. The positive hole injecting layer 36, the interlayer 37, and the luminescence layer 38 function as carrier transporting layers through which electrons and positive holes are transported as carriers. The carrier transporting layers are adjoined on their both sides by an interlayer insulating film 33, an insulating layer 35, and a partitioning wall 39 that are disposed along the column direction.

The gate electrodes 11g, 12g, and 13g of the first selector transistor Tr11, the second selector transistor Tr12, and the luminescence driving transistor Tr13 are formed on the pixel substrate 31 of each pixel. The gate electrodes 11g, 12g, and 13g are formed by patterning the gate conductive layer. The one electrode Cs1 of the capacitor Cs is also formed on the pixel substrate 31 of each pixel. The data line Ld that is formed by patterning the gate conductive layer and that extends along the column direction is also formed on the pixel substrate 31 to adjoin the pixel. The insulating film 32 that functions as a gate insulating film or the dielectric of the capacitor Cs is formed to cover the gate electrodes 11g, 12g, and 13g, the one electrode Cs1, and the data line Ld.

In a case where the organic EL element 21 is a bottom emission type that emits display light through the pixel substrate 31, the capacitor electrode Cs1 and the pixel electrode 34 should be transparent electrodes made of tin-oxide-added indium oxide (Indium Tin Oxide; ITO), zinc-oxide-doped indium oxide (Indium Zinc Oxide), or the like, and the capacitor electrode Cs1 is formed to overlap the gate electrode 13g of the luminescence driving transistor Tr13 at the contact portion 44. If the gate conductive layer contains aluminum and the capacitor electrode Cs1 is made of ITO, it is possible to prevent a battery reaction, by forming the capacitor electrode Cs1 first by patterning and then patterning the gate conductive layer next. In a case where the organic EL element 21 is a top emission type that emits display light through the opposing electrode 40, the opposing electrode 40 should be a transparent electrode made of ITO or the like while the capacitor electrode Cs1 needs not be transparent. Therefore, it is possible to form the capacitor electrode Cs1 at the same time as and integrally with the gate electrode 13g of the luminescence driving transistor Tr13, by patterning the gate conductive layer. Patterning of the gate conductive layer can be completed at one stroke by photolithography. Therefore, in the case of a top emission type, it is possible to simplify the manufacturing process of the gate electrode 13g and the capacitor electrode Cs1.

The insulating film is made of an insulating material such as a silicon oxide film, a silicon nitride film, etc. and formed on the pixel substrate 31 to cover the data line Ld, the gate electrodes 12g and 13g, and the capacitor electrode Cs1. Contact portions are formed in the insulating film 32 as contact holes to bring the gate conductive layer and the source-drain layer in contact with each other.

The first selector transistor Tr11, the second selector transistor Tr12, and the luminescence driving transistor Tr13 are n-channel type Thin Film Transistors (TFTs). As shown in FIG. 4, each transistor is formed above the pixel substrate 31. As shown in FIG. 4, the second selector transistor Tr12 includes: a semiconductor layer 121 that comprises a-Si or microcrystalline silicon; a protective insulating film 122; the drain electrode 12d; the source electrode 12s; ohmic contact layers 124 and 125 that comprise n-type-impurity-containing a-Si or n-type-impurity-containing microcrystalline silicon; and the gate electrode 12g. The luminescence driving transistor Tr13 includes: a semiconductor layer 131 that comprises a-Si or microcrystalline silicon; a protective insulating film 132; the drain electrode 13d; the source electrode 13s; ohmic contact layers 134 and 135 that comprise n-type-impurity-containing, a-Si or n-type-impurity-containing microcrystalline silicon; and the gate electrode 13g. Though not illustrated, the first selector transistor Tr11 has the same configuration as the second selector transistor Tr12.

The luminescence driving transistor Tr13 has a larger size than the first selector transistor Tr11 and a larger size than the second selector transistor Tr12 in order to supply a current to the organic EL element 21 to drive it to luminescence. That is, the semiconductor layer 131 of the luminescence driving transistor Tr13 has a longer channel width than that of the semiconductor layer of the first selector transistor Tr11 and that of the semiconductor layer 121 of the second selector transistor Tr12. Therefore, the source and drain electrodes 13s and 13d of the luminescence driving transistor Tr13 are longer than the source and drain electrodes 11s and 11d of the first selector transistor Tr11 and longer than the source and drain electrodes 12s and 12d of the second selector transistor Tr12. In the luminescence driving transistor Tr13, the source and drain electrodes 13s and 13d and the channel width of the semiconductor layer 131 extend along the column direction.

In each of the transistors Tr11, Tr12, and Tr13, the gate electrode is formed of an opaque gate conductive layer that comprises one selected from at least, for example, a Mo film, a Cr film, an Al film, a Cr/Al stacked film, an AlTi alloy film, an AlNdTi alloy film, a MoNb alloy film, etc. Since the gate electrodes 11g, 12g, and 13g of the first selector transistor Tr11, the second selector transistor Tr12, and the luminescence driving transistor Tr13 that are formed of the gate conductive layer are opaque to the light emitted by the organic EL element 21, they can shield light that heads toward the semiconductor layers of the first selector transistor Tr11, the second selector transistor Tr12, and the luminescence driving transistor Tr13 from below these transistors. The drain electrodes and source electrodes of the transistors Tr11, Tr12, and Tr13 are formed of the source-drain conductive layer that is made of, for example, aluminum-titanium (AlTi)/Cr, AlNdTi/Cr, Cr, or the like. An ohmic contact layer is formed between the drain electrode and the semiconductor layer and between the source electrode and the semiconductor layer in order to give low-resistance contact between them.

In the present embodiment, as shown in FIG. 1 and FIG. 3, the drain electrodes 13d of the luminescence driving transistors Tr13 in each column are connected to one another to function as part of the column-direction connecting line Lc. Therefore, the four current supply lines La that extend in the row direction and the column-direction connecting lines Lc come to have a lower resistance as a whole as connected in mesh in the row direction and the column direction, suppressing voltage decrease. Making the drain electrode 13d serve also as the line that connects the current supply lines La makes it unnecessary for the pixel substrate to have a special region on which the line for connecting the current supply lines La is formed. Therefore, it is possible to suppress voltage decrease along the current supply line La without lowering the aperture ratio of the organic EL element (the ratio of the area of the luminescence layer 38 interposed between the pixel electrode 34 and the opposing electrode 40). The gate line Lg that runs in the same direction as the current supply line La is formed of the third metal layer that is not the source-drain conductive layer that forms the source electrodes and drain electrodes of the transistors. Since the gate line Lg that extends along the row direction crosses the column-direction connecting line Lc (drain electrode 13d) via the interlayer insulating film 33 that is formed below the gate line Lg, the gate line Lg is electrically insulated by the interlayer insulating film 33 from the current supply line La and the column-direction connecting line Lc. The contact portion 49 as a contact hole is formed in a portion of the interlayer insulating film 33 that is above the drain electrode 13d and the current supply line La such that the conductive layer 48 is deposited on and connected to the drain electrode 13d and the current supply line La through the contact portion 49. Therefore, the current supply line La and column-direction connecting line Lc, and the conductive layer 48 are connected to each other, making it possible to further lower the resistance of the lines as a whole and suppress voltage decrease. Since the conductive layer 48 is formed of the third metal layer that forms the gate line Lg, it is possible to form the conductive layer 48 without adding a step for forming the conductive layer 48.

The pixel electrode (anode electrode) 34 is made of a conductive material having light transmissivity such as tin-oxide-added indium oxide (Indium Tin Oxide; ITO), zinc-oxide-doped indium oxide (Indium Zinc Oxide), etc. Each pixel electrode 34 is spaced from the pixel electrodes 34 of adjoining other pixels 30.

The interlayer insulating film 33 is made of an insulating material, for example, a silicon nitride film, has a substantially quadrangular aperture 33a that is opened in the center of each pixel electrode 34, and is disposed between adjoining pixel electrodes 34 to surround each pixel electrode 34. The interlayer insulating film 33 is formed to cover the transistors Tr11, Tr12, and Tr13, the current supply line La, etc. As shown in FIG. 5, the gate line Lg and the conductive layer 48 are formed above the interlayer insulating film 33, and the insulating layer 35 that comprises an insulating material, for example, a silicon nitride film, is formed to cover the gate line Lg and the conductive layer 48. The insulating layer 35 has an aperture 35a having substantially the same shape as the aperture 33a. The aperture 33a and the aperture 35a define the luminescence layer 38 interposed between the pixel electrode 34 and the opposing electrode 40, i.e., the luminescence region of each pixel 30. The partitioning wall 39 has a groove-like opening 39b that extends along the column direction (up-down direction of FIG. 3) over a plurality of pixels 30.

The partitioning wall 39 is made of a cured insulating material, for example, a photosensitive resin such as polyimide, and formed above the interlayer insulating film 33 and the insulating layer 35. As shown in FIG. 3, the partitioning wall 39 is formed into a stripe shape and has the opening 39b. The partitioning wall 39 partitions the pixels 30 during the manufacturing process such that a liquid that contains a material that makes the luminescence layer 38, formed on the pixel electrode 34, of a R (red) pixel 30, a liquid that contains a material that makes the luminescence layer 38, formed on the pixel electrode 34, of G (green) pixel 30, and a liquid that contains a material that makes the luminescence layer 38, formed on the pixel electrode 34, of a B (blue) pixel 30 do not flow out, when coated on the pixel electrodes 34, into adjoining pixels 30 in the row direction that emit different colors to prevent color mixture in the luminescence layers 38. The planer shape of the partitioning wall 39 is not limited to the stripe shape, but may be a grid shape.

The positive hole injecting layer 36 is formed above the pixel electrode 34 and has a function of supplying positive holes into the luminescence layer 38. The positive hole injecting layer 36 comprises an organic polymeric material, a low-polymer material, or an inorganic compound that is capable of injecting and transporting positive holes (holes). An organic-compound-containing liquid that contains an organic polymeric hole injecting/transporting material may be, for example, a PEDOT/PSS aqueous solution, which is a dispersed liquid prepared by dispersing polyethylenedioxythiophene (PEDOT) as a conductive polymer and polystyrene sulfonate (PSS) as a dopant in an aqueous solvent. In this case, the positive hole injecting layer 36 is formed by coating and drying the PEDOT/PSS aqueous solution. An inorganic compound may be molybdenum oxide having a high resistance. In this case, the positive hole injecting layer 36 is foil led by sequentially depositing molybdenum oxide films on the pixel electrode 34 and on the surface of the partitioning wall 39.

The interlayer 37 is formed above the positive hole injecting layer 36. The interlayer 37 is an organic compound layer provided for improving the luminescence efficiency of the luminescence layer 38, with a function of facilitating recombination of electrons and positive holes in the luminescence layer 38 by controlling the positive hole injection property of the positive hole injecting layer 36.

The luminescence layer 38 is formed above the interlayer 37. The luminescence layer 38 has a function of emitting light when a voltage is applied across the anode electrode and the cathode electrode. The luminescence layer 38 is made of a luminescence material for red (R), green (U), or blue (B) that contains a known polymeric luminescence material that can emit fluorescent light or phosphorescent light, for example, a conjugated double-bond polymer of a polyparaphenylene vinylene series, a polyfluorene series, etc. The luminescence material is dissolved (or dispersed) in an arbitrary one of an aqueous solvent and organic solvents of tetralin, tetramethylbenzene, mesitylene, xylene, etc. to be prepared as a solution (dispersed liquid). The luminescence layer 38 is formed by coating the solution (dispersed liquid) by a nozzle coating method that ejects the solution (dispersed liquid) in the form of a continuous liquid flow or an ink jetting method that ejects the solution (dispersed liquid) in the form of a plurality of liquid droplets, and then volatilizing the solvent.

In the case of a bottom emission type, the opposing electrode (cathode electrode) 40 has a stacked structure that includes: a layer that is formed on the luminescence layer 38 and comprises a conductive material, for example, a low-work-function material such as Li, Mg, Ca, Ba, etc.; and a light-reflective conductive layer made of Al or the like stacked upon that layer. In the case of a top emission type, the opposing electrode 40 has a transparent stacked structure that includes: a light-transmissive low-work-function layer that is formed on the luminescence layer 38, has a very small film thickness of about 10 nm, and comprises a low-work-function material such as Li, Mg, Cu, Ba, etc.; and a light-transmissive conductive layer made of ITO or the like with a film thickness of about 100 nm to 200 nm. In the present embodiment, the opposing electrode 40 is formed of a single electrode layer that is formed over a plurality of pixels 30, and a common voltage Vss, which may be a ground potential, is applied to the opposing electrode 40.

Next, the operation of the luminescence device 10 and the operation of the pixels 30 according to the present embodiment will be explained with reference to FIG. 6A, FIG. 6B, and FIG. 7. Assume that the current supply lines La of each "d" rows (where "d" is an integer equal to or greater than 2) are connected to one another as a unit group, and a scan period $T_{SC}$ is a period during which each of the gate lines Lg of the first to n-th row is scanned (where n=c×d, where "c" is an integer equal to or greater than 2). In this case, the total of the scan periods of gate lines Lg corresponding to "d" rows that are connected to one another, i.e., the total of the periods during which the gate lines Lg that correspond to a group of the i-th to (i+d−1)th rows (where i=d×k−(d−1)=d(k−1)+1, where "k" is a natural number equal to or smaller than n/d) are selected respectively is, as shown in FIG. 7, a group writing voltage period $T_{WR}$ (=d×$T_{SC}$) for each group of "d" rows. For each group of "d" rows, the group writing voltage period $T_{WR}$ is followed by a group emission voltage period $T_{EM}$, which is an emission period, and then by the next group writing voltage period $T_{WR}$ and the next group emission voltage period $T_{EM}$ repeatedly.

In accordance with a group of control signals output by a control circuit, a gate driver outputs pulses of a high level (on level ON) sequentially to the gate lines Lg of the first to n-th rows. In the present embodiment, the current supply lines La of each four rows are connected to one another as a unit by the column-direction connecting line Lc. Therefore, in accordance with a group of control signals output b the control circuit, the power supply or the current supply driver sequentially outputs pulses of a low level L to the current supply lines La of each four rows starting from the first four rows including the first current supply line La, regarding that "d=4", As shown in FIG. 7, the scan periods $T_{SC}$ of the respective gate lines Lg of the i-th to (i+d−1)th rows in each group, during which pulses of the on level ON are output to these gate lines Lg respectively, are shifted from one another. However, these scan periods $T_{SC}$ are set within one group writing voltage period $T_{WR}$ during which a pulse of the low level L is output to the current supply lines La of the i-th to (i+d−1) rows. In the present embodiment, the current supply lines La of the i-th to (i+d−1)th rows are connected to one another by the column-direction connecting line Lc. Therefore, the temporal length of the pulse of the low level L to the current supply lines La of the i-th to (i+d−1)th rows is equal to the sum of the scan periods $T_{SC}$ during which pulses of the on level ON are sequentially output to the gate lines Lg of the i-th to (i+d−1)th rows, i.e., equal to the group writing voltage period $T_{WR}$. That is, a pulse of the low level L is output to the group of the current supply lines La of the i-th to (i+d−1)th rows from when a pulse that switches from an off level OFF to the on level ON is output to the gate line Lg of the i-th row until a pulse that switches from the on level ON to the off level OFF is output to the gate line Lg of the (i+d−1)th row. During the period in which pulses of the ON level ON are output to the gate lines Lg of the respective rows, a data driver outputs display signals representing sink currents that match emission luminance gray levels (i.e., currents that are input to the data driver) to the data lines Ld in all the columns in accordance with a group of control signals output by the control circuit. Here, the data driver is either a current driver that makes a gray level current that has a current value matching image data received by the control circuit flow, or a voltage driver that applies a gray level voltage that makes a current that has a current value matching image data flow. The data driver makes a sink current flow through the data line Ld in each column by outputting a display signal thereto.

A current flow in each pixel 30 and voltage application thereto will now be explained in detail.

At the start time t, of the scan period $T_{SC}$ of the i-th row, a scan driver starts to output a pulse of the high level (on level ON) to the gate line Lg of the i-th row. During the scan period $T_{SC}$ from the time t, to immediately before the time $t_{(i+1)}$, a scan signal voltage of the on level ON that switches the first selector transistors Tr11 and the second selector transistors Tr12 into an ON state is applied across the gate line Lg of the i-th row. Then, at the start time $t_{(i−1)}$ of the scan period $T_{SC}$ of the (i+1)th row, the scan driver outputs a pulse of the high level (on level ON) to the gate line Lg of the (i+1)th row. During the period from the time $t_{(i−1)}$ to immediately before the time $t_{(i+2)}$, a scan signal voltage of the on level ON that switches the first selector transistors Tr11 and the second selector transistors Tr12 into an ON state is applied across the gate line Lg of the (i+1)th row. Likewise, during the period from the time $t_{(i+2)}$ to immediately before the time $t_{(i+3)}$, which is the scan period $T_{SC}$ of the (i+2)th row, a scan signal voltage of the on level ON that switches the first selector transistors Tr11 and the second selector transistors Tr12 into an ON state is applied across the gate line Lg of the (i+2)th row. During the period from the time $t_{(i+3)}$ to immediately before the time $t_{(i+4)}$, which is the scan period $T_{SC}$ of the (i+3)th row, a scan signal voltage of the on level ON that switches the first selector transistors Tr11 and the second selector transistors Tr12 into an ON state is applied across the gate line Lg of the (i+3)th row.

At the start time $t_i$ of the group writing voltage period $T_{WR}$ of the group of "d" rows from the i-th to (i+d−1)th rows, the power supply or the current supply driver outputs a pulse signal of the low level L to the current supply lines La of the group of the i-th to (i+d−1)th rows. The low level L is equal to or lower than a reference potential Vss. During each scan period $T_{SC}$, the data driver makes a sink current having a predetermined current value flow in accordance with image data received by the control circuit.

During the scan period $T_{SC}$ of the gate line Lg of the i-th row, the first selector transistor Tr11 and the second selector transistor Tr12 are switched on and the data driver makes a current-controlling sink current having a voltage value equal to or lower than the reference voltage Vss flow through the data line Ld in each column. As a result, a voltage matching the current value of the sink current is applied across the gate and one end of the source of the luminescence driving transistor Tr13, and as shown in FIG. 6A, the sink current flows into the luminescence driving transistor Tr13 through the data line Ld and the second selector transistor Tr12.

The gate electrode 13g and drain electrode 13d of the luminescence driving transistor Tr13 are equipotential. Therefore, a potential difference occurs across the gate and source of the luminescence driving transistor Tr13, which makes a sink current I having a current value matching the voltage designated by the data driver (i.e., a current value matching image data) flow through each data line Ld in the direction indicated by the arrow K shown in FIG. 6A. During the scan period $T_{SC}$, a power supply signal voltage to the current supply line La is equal to or lower than a reference voltage H. Therefore, the anode potential is lower than the cathode potential in the organic EL element 21, to which a reverse bias voltage is thus applied. Therefore, the current from the current supply line La does not flow into the organic EL element 21.

At this time, the voltage across both ends of the capacitor Cs of each pixel 30 becomes a voltage that matches the current value of the current flowing through the drain electrode 13d and the source electrode 13s of the luminescence driving transistor Tr13 based on the display signal controlled by the data driver. That is, the capacitor Cs of each pixel 30 is charged with charges enough to induce a potential difference across the gate and source of the luminescence driving transistor Tr13, which potential difference makes the current I matching the display signal flow into the luminescence driving transistor Tr13.

Such an operation is repeated in the scan periods $T_{SC}$ of the respective i-th to (i+d−1)th rows. At the end time $t_{(i+d)}$ of the group writing voltage period $T_{WR}$, the pulse output by the scan driver to the gate line Lg of the (i+d−1)th row switches from the on level ON to the off level OFF, and the signal output by the power supply or the current supply driver to the current supply lines La of the i-th to (i+d−1)th rows switches from the low level L to the high level H. Therefore, during the group emission voltage period $T_{EM}$ of the group of the i-th to (i+d−1)th rows that is between the end time $t_{(i+d)}$ and the start time $t_i$ of the next group writing voltage period $T_{WR}$, a scan signal voltage of the off level OFF (low level) that switches off the gate of the first selector transistors Tr11 and the gate of the second selector transistors Tr12 is applied to the gate lines Lg of the i-th to (i+d−1)th rows, and the power supply signal voltage applied to the current supply lines La of the i-th to (i+d−1)th rows is a power supply voltage H of the high level that is sufficiently higher than the reference potential Vss and the potential of the low level L that was output during the group writing voltage period $T_{WR}$.

Hence, as shown in FIG. 6B, during the group emission voltage period $T_{EM}$, the second selector transistors Tr12 of the rows that are in the non-selected state are switched off to allow no current to flow therethrough. Further, during the group emission voltage period $T_{EM}$, the first selector transistors Tr11 are switched off and the capacitors Cs retain the charges that have been charged across their one end and other end in order to keep the luminescence driving transistors Tr13 in the ON state. That is, the value of the gate-source voltage $V_{GS}$ of the luminescence driving transistors Tr13 that is applied during the group emission voltage period $T_{EM}$ and the value of this gate-source voltage $V_{GS}$ applied during the group writing voltage period $T_{WR}$ that is immediately ahead of the group emission voltage period $T_{EM}$ are equal. Therefore, also during the group emission voltage period $T_{EM}$, the current having the current value matching the image data flows through the luminescence driving transistors Tr13. Therefore, the current value of the current I that flows during the group emission voltage period $T_{EM}$ is equal to the current value of the current K that flowed during the group writing voltage period $T_{WR}$ that is ahead of the group emission voltage period $T_{EM}$. During the group emission voltage period $T_{EM}$, the current K that flows through the luminescence driving transistors Tr13 flows into the organic EL elements 21, which hence emit light at the luminance matching the current value of the current I flowing thereinto. In this way, the organic EL elements 21 emit light at a luminance gray level that matches the display signal.

When the group writing voltage period $T_{WR}$ of the gate lines Lg of the i-th to (i+d−1)th rows ends, a successive group writing voltage period $T_{WR}$ comes during which the gate lines Lg of the group of the (i+d)th to (i+2d−1)th rows will be selected sequentially and the signal output by the power supply or the current supply driver to the current supply lines La of the (i+d)th to (i+2d−1)th rows will be the low level Las switched from the high level H. In this way, the voltage to the current supply lines La of each "d" rows that are connected to one another is switched such that writing is performed group by group. When writing is completed for all the rows, the scan period $T_{SC}$ of the gate line Lg of the first row comes again to repeat writing.

Next, a method of manufacturing the bottom-emission type luminescence device according to the present embodiment will be explained with reference to FIGS. 8A to 8C, FIG. 9A, FIG. 9B, FIG. 10A, and FIG. 10B. The first selector transistor Tr11, the second selector transistor Tr12, and the luminescence driving transistor Tr13 are similar to one another in their basic structure except the length of the channel width, and the first selector transistor Tr11 is formed through the same process as the second selector transistor Tr12. Therefore, explanation about, the formation of the first selector transistor Tr11 will not be given.

First, the pixel substrate 31 that comprises a glass substrate or the like is prepared. A transparent conductive film made of ITO or the like is deposited on the pixel substrate 31 by sputtering, vacuum vapor deposition, or the like, and the capacitor electrode Cs1 is formed by patterning the transparent conductive film by photolithography.

Figure 8A:
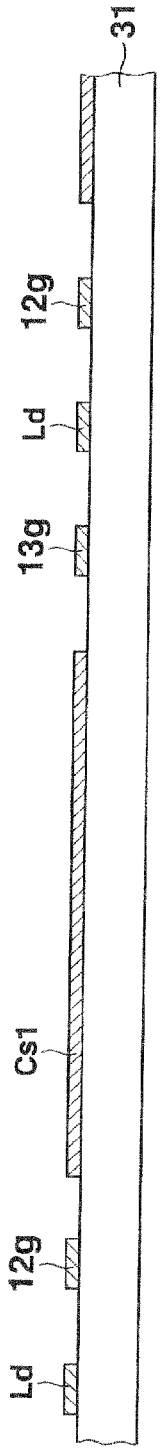
FIGS. 8A to 8C are diagrams showing a method of manufacturing the luminescence device according to the embodiment 1.

Then, a gate conductive film that comprises at least one of, for example, a Mo film, a Cr film, an Al film, a Cr/Al stacked film, an AlTi alloy film, an AlNdTi alloy film, and a MoNb alloy film is deposited on the pixel substrate 31 by sputtering, vacuum vapor deposition, or the like. The deposited gate conductive film is patterned into the shapes of the gate electrodes 12g and 13g of the transistors Tr12 and Tr13 and the data line Ld as shown in FIG. 8A. At this time, the gate electrode 13g of the luminescence driving transistor Tr13 is formed to overlap the capacitor electrode Cs1 at the contact portion 44. Since the transparent metal oxide such as ITO that makes the capacitor electrode Cs1 has a high contact resistance with respect to Al, it is preferred that the gate conductive film be an Mo film or an MoNb alloy film that has a relatively low contact resistance with respect to the transparent metal oxide such as ITO. In the case of a top emission type, the capacitor electrode Cs1 needs not be transparent and hence will be formed by patterning the gate conductive film to be integrated with the gate electrode 13g of the luminescence driving transistor Tr13 and with the source electrode 11s of the first selector transistor Tr11. Therefore, material selection is free from the limitation imposed by the capacitor electrode Cs1 being the transparent conductive film.

Then, the insulating film 32, an amorphous silicon film, and a silicon nitride film are sequentially deposited on the gate electrodes 12g and 13g, the capacitor electrode Cs1, and the data line Ld by Chemical Vapor Deposition (CVD) or the like, and the silicon nitride film is patterned into the protective insulating films 122 and 132.

Figure 8B:
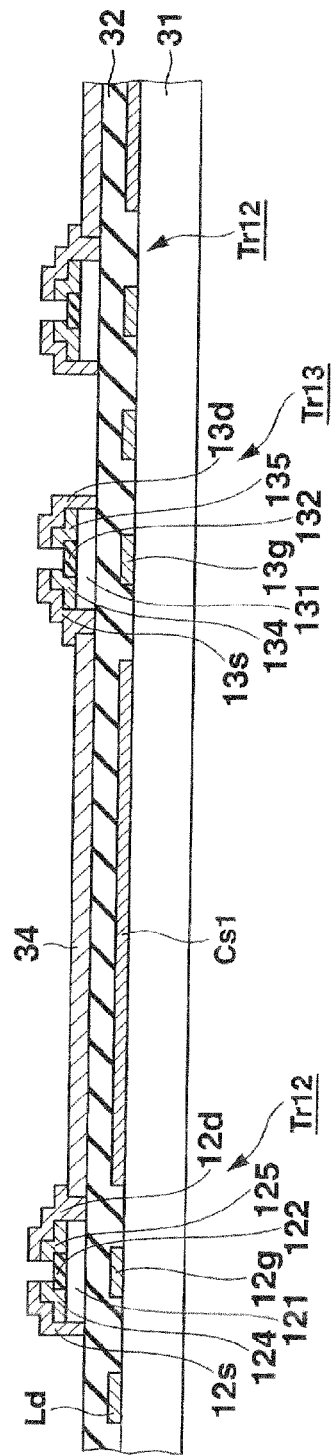

Next, an amorphous silicon film that contains an n-type impurity is deposited by CVD or the like and patterned into the ohmic contact layers 124, 125, 134, and 135 as shown in FIG. 8B, and the amorphous silicon film formed earlier is patterned into the semiconductor layers 121 and 131 of the transistors Tr12 and Tr13.

Next, in the case of a bottom emission type, a transparent conductive film made of ITO or the like is deposited on the insulating film 32 by sputtering, vacuum vapor deposition, or the like. In the case of a top emission type, a light-reflective conductive film and a transparent conductive film made of ITO or the like are deposited on the insulating film 32 by sputtering, vacuum vapor deposition or the like. The deposited film(s) is/are patterned by photolithography into the pixel electrode 34.

Then, after contact portions 41 and 43 are formed in the insulating film 32 in the form of through holes, a source-drain conductive film that comprises at least one of, for example, a Mo film, a Cr film, an Al film, a Cr/Al stacked film, an AlTi alloy film, an AlNdTi alloy film, a MoNb alloy film, etc. is deposited by sputtering, vacuum vapor deposition, or the like, and patterned by photolithography into the drain electrodes 12d and 13d, the source electrodes 12s and 13s, the current supply line La, and the column-direction connecting line Lc as shown in FIG. 3 and FIG. 8B. At this time, the source electrode 13s of the luminescence driving transistor Tr13 and the drain electrode 12d of the second selector transistor Tr12 are formed to overlap the pixel electrode 34. In this way, the source electrode 13s of the luminescence driving transistor Tr13 and the drain electrode 12d of the second selector transistor Tr12 are connected to each other via the pixel electrode 34. Therefore, there is no need of laying an interconnecting line between the second selector transistor Tr12 and the luminescence driving transistor Tr13 to connect them to each other, contributing to increasing the aperture ratio of the pixel. At the same time as the contact portions 41 and 43 are formed in the insulating film 32, contact holes from which a connection terminal of the gate line Lg for connecting to the gate driver and a connection terminal of the data line Ld for connecting to the data driver are exposed may be formed in the insulating film 32. Alternatively, by depositing the conductive film that forms the pixel electrode 34 on the insulating film 32 after these contact holes and the contact portions 41 and 43 are formed therein and then patterning the conductive film by photolithography, it is possible to form, at the same time as forming the pixel electrode 34, a three-layered connection portions, in which the conductive film that forms the pixel electrode 34 is interposed between the gate conductive film and the source-drain conductive film, at the contact portions 41 and 43.

Figure 8C:
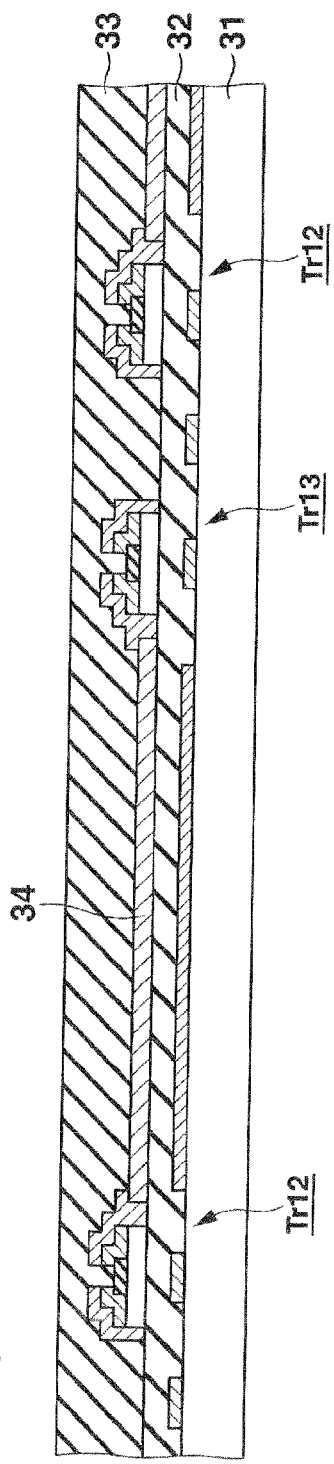

Next, the interlayer insulating film 33 that comprises a silicon nitride film is deposited by CVD or the like to cover the transistors Tr12 and Tr13, etc. as shown in FIG. 8C.

Openings are formed in the interlayer insulating film 33 by photolithography or the like to form the contact portion 49 and the contact portion 42. Then, a metal film that comprises, for example, a Mo film, a Cr turn, an Al film, a Cr/Al stacked film, an AlTi alloy film or an AlNdTi alloy film, a MoNb alloy film, or the like is deposited by vacuum vapor deposition or sputtering. Then, the metal film is patterned by photolithography into the conductive layer 48 that is connected to the column-direction connecting line Lc and the current supply line La via the contact portion 49 as shown in FIG. 3 and FIG. 9A, and into the gate line Lg that is connected to the gate electrode 12g of the second selector transistor Tr12 and the gate electrode 11g of the first selector transistor Tr11 via the contact portion 42. Then, the insulating layer 35 that comprises a silicon nitride film or the like is deposited to cover the conductive layer 48 and the gate line Lg. Next, the aperture 35a from which the pixel electrode 34 is exposed is formed in the insulating layer 35 and the interlayer insulating film 33 as shown in FIG. 9B.

Figure 10A:
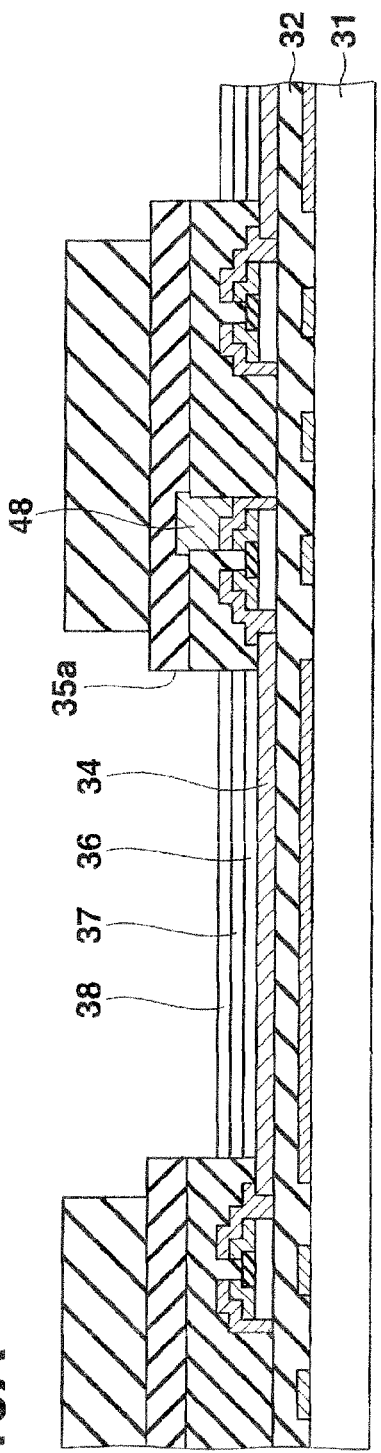
FIGS. 10A and 10B are diagrams showing the method of manufacturing the luminescence device according to the embodiment 1.

Next, photosensitive polyimide is coated so as to cover the interlayer insulating film 33 and the insulating layer 35, and patterned by exposure development, and burning via a mask that matches the shape of the partitioning wall 39 to thereby form the partitioning wall 39 as shown in FIG. 10A.

Then, an organic-compound-containing liquid that contains a positive hole injecting material is coated selectively on the pixel electrode 34 that is confined in the aperture 35a by a nozzle printing device that pours out the liquid in a continuous flow, an ink jetting device that ejects the liquid in the form of a plurality of independent liquid droplets, or a rolling printer. Then, the pixel substrate 31 is heated under the atmospheric condition to volatilize the solvent in the organic-compound-containing liquid to thereby form the positive hole injecting layer 36. The organic-compound-containing liquid may be coated under a heating atmosphere. Other than by the wet film formation manner described above, the positive hole injecting layer 36 may be formed by vapor deposition.

Then, an organic-compound-containing liquid that contains the material to make the interlayer 37 is coated over the positive hole injecting layer 36 by a nozzle printing device, an ink jetting device, or a rolling printer. The coated liquid is heated and dried under a nitrogen atmosphere or under vacuum to remove the residual solvent to thereby form the interlayer 37. The organic-compound-containing liquid may be coated under a heating atmosphere.

Next, an organic-compound-containing liquid that contains a polymeric luminescence material (R, G. B) is likewise coated by a nozzle printing device, an ink jetting device, or a rolling printer, and heated under a nitrogen atmosphere to remove the residual solvent to form the luminescence layer 38. The organic-compound-containing liquid may be coated under a heating atmosphere.

In the case of a bottom emission type, the opposing electrode 40 to be formed on the pixel substrate 31 on which layers up to the luminescence layer 38 have been formed is deposited by vacuum vapor deposition or sputtering as a dual-layered structure that includes: a layer that comprises a low-work-function material such as Li, Mg, Ca, Ba, etc.; and a light-reflective conductive layer made of Al or the like. In the case of a top emission type, the opposing electrode 40 is formed as a transparent stacked structure that includes: a light-transmissive low-work-function layer that comprises a low-work-function material such as Li, Mg, Ca, Ba, etc. and has a very small film thickness of about 10 nm; and a light-transmissive conductive layer that is formed above that layer, made of ITO or the like, and has a film thickness of about 100 nm to 200 nm.

Next, a sealing resin that comprises an ultraviolet curable resin or a thermosetting resin is coated on a portion of the pixel substrate 31 that is outside the display region on which the plurality of pixels 30 have been formed, and the pixel substrate 31 and a sealing substrate are joined together. Then, the sealing resin is cured by ultraviolet or heat to secure the pixel substrate 31 and the sealing substrate together.

Figure 10B:
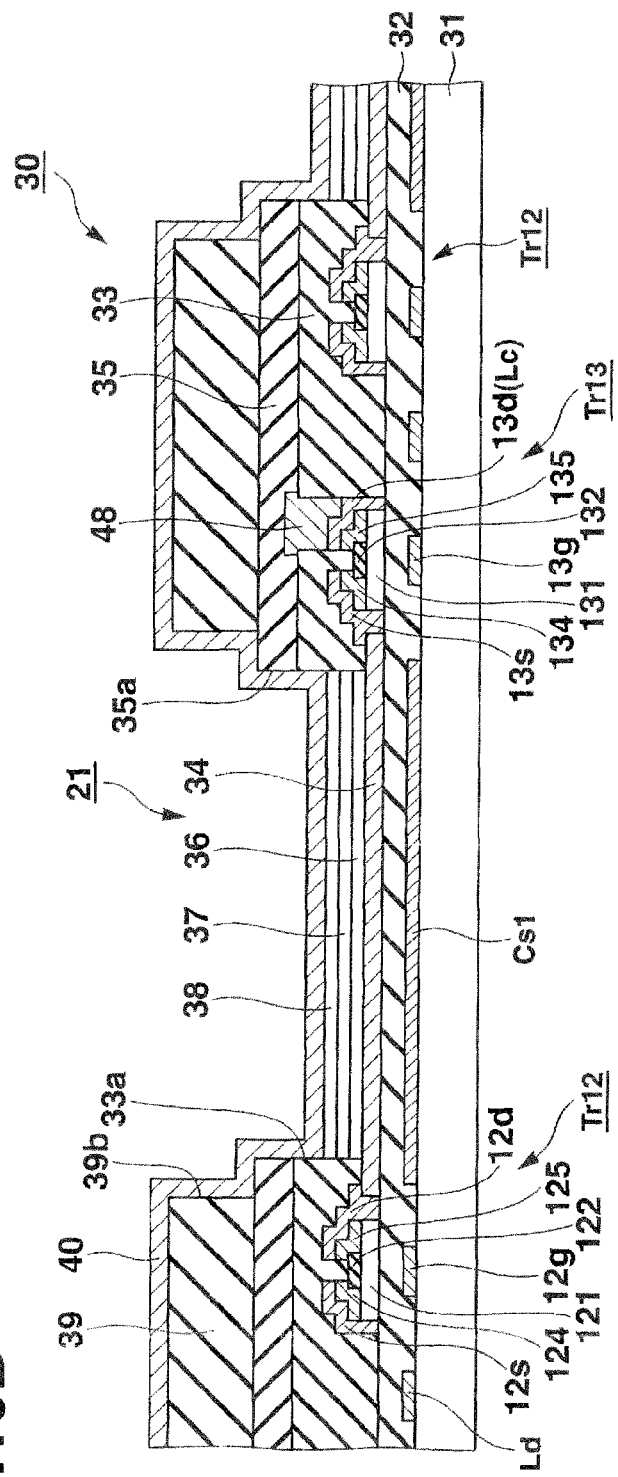

Through these steps, the luminescence device 10 is manufactured as shown in FIG. 10B.

In the present embodiment, the column-direction connecting lines Lc are formed in a manner to connect the drain electrodes 13d of the luminescence driving transistors 13 to one another in each unit group of a plurality of rows, such that a plurality of current supply lines La that are formed in the row direction are connected in mesh. This makes it possible to suppress the voltage applied across the current supply lines La from decreasing due to their wire resistance, and to achieve a line luminescence from the plurality of organic EL elements. Particularly, in the present embodiment, each column-direction connecting line Lc is an elongation of the drain electrodes 13d in the column direction of the pixels, which makes it unnecessary for the pixel substrate 31 to have a special region on which the line for connecting the current supply lines La is formed separately from the drain electrodes 13d. Therefore, it is possible to suppress voltage decrease along the current supply lines La without lowering the aperture ratio of the pixels 30.

In the present embodiment, the drain electrodes 13d are elongated and hence cross the gate line Lg. Therefore, the gate line Lg is formed of the third metal layer that is neither the gate conductive layer nor the source-drain layer. By forming the third metal layer on the current supply line La and the drain electrode 13d at the same time as forming the gate line Lg from the third metal layer, it is possible to increase the thickness of the current supply line La and realize a lower resistance across the current supply line La with no additional manufacturing step.

Figure 11:
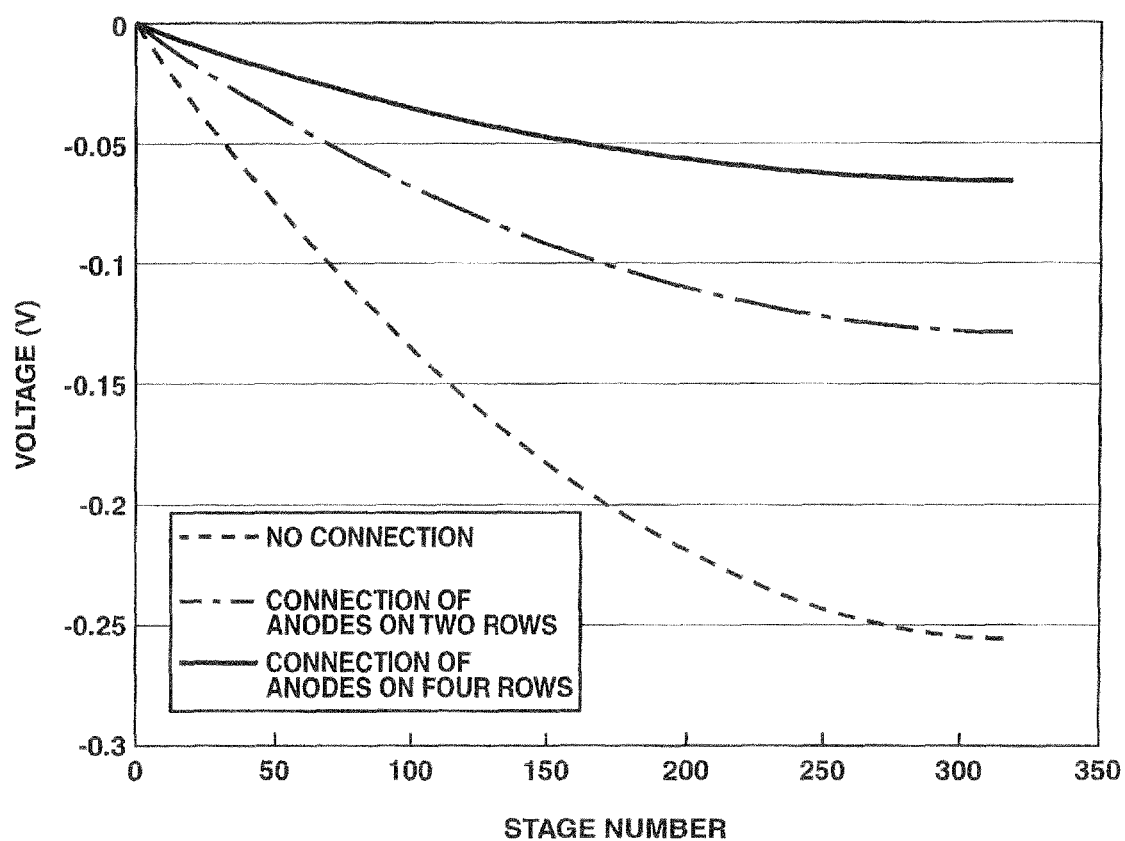
FIG. 11 is a diagram that shows calculations of degrees of voltage decrease in a case where a column-direction connecting line is provided and in a case where no column-direction connecting line is provided.

FIG. 11 shows results of a simulation. FIG. 11 shows calculation results of degrees of voltage decrease in three cases of the same example in which the data lines, the current supply lines, and the pixels were disposed as shown in FIG. 1. The first case was that the current supply lines of the respective rows were electrically independent. The second case was that the current supply lines of each two rows were connected to each other. The third case was that the current supply lines of each four rows were connected to one another. In this example, it was assumed that the wire resistance of the current supply line that has a length of one pixel (corresponding to the length between adjoining data lines) was R1, and the resistance of the column-direction connecting line that has a length of one pixel (corresponding to the length between adjoining current supply lines) was R2. FIG. 11 shows the potential of each pixel in a case where R1 was 5Ω, R2 was 100Ω, and a current of 1 µA was drawn from each data line. Here, it was assumed that 320 pixels were arranged in the transverse direction (row direction), and pixels closer to the power supply or the current supply driver (i.e., pixels under lower wire resistance) were assigned smaller stage numbers. The simulation was conducted on the premise that the power supply or the current supply driver was supplied only from the direction of the first pixel.

As obvious from FIG. 11, in the case where the current supply lines were not connected, the voltage decrease from the pixel on the first stage to the pixel on the 320th stage was about 0.25V. In both the cases where the current supply lines were connected to each other or one another in the column direction, the voltage decrease could be suppressed as compared with the above case; in the case where each two rows were connected, the voltage decrease was about the half of the above case of about 0.12V whereas in the case where each four rows were connected, the voltage decrease was about 0.06V. Therefore, also from FIG. 11, it is possible to say that it is possible to suppress voltage decrease by connecting the current supply lines by the column-direction connecting lines. Particularly, in a case where the data driver is a voltage driver that applies to the data lines Ld, a gray level voltage for making a current having a current value that matches image data flow, the current value of the current that flows between the drain and source of the luminescence driving transistors Tr13 is more uneven from transistor Tr13 to transistor Tr13, as the voltage across the current supply line La is more uneven from pixel 30 to pixel 30. Therefore, in such a case, the configuration of the present embodiment will produce a more remarkable effect.

Embodiment 2

A luminescence device and a method of manufacturing a luminescence device according to the embodiment 2 will be explained with reference to the drawings. The difference between the luminescence device according to the present embodiment and the embodiment 1 described above is that in the embodiment 1, the gate lines Lg are formed of the third metal layer that is above the source-drain conductive layer, while in the present embodiment, the column-direction connecting lines are formed of the third metal layer. Any members that are the same as those of the embodiment 1 will be denoted by the same reference numerals as those members and will not be described in detail.

Figure 12:
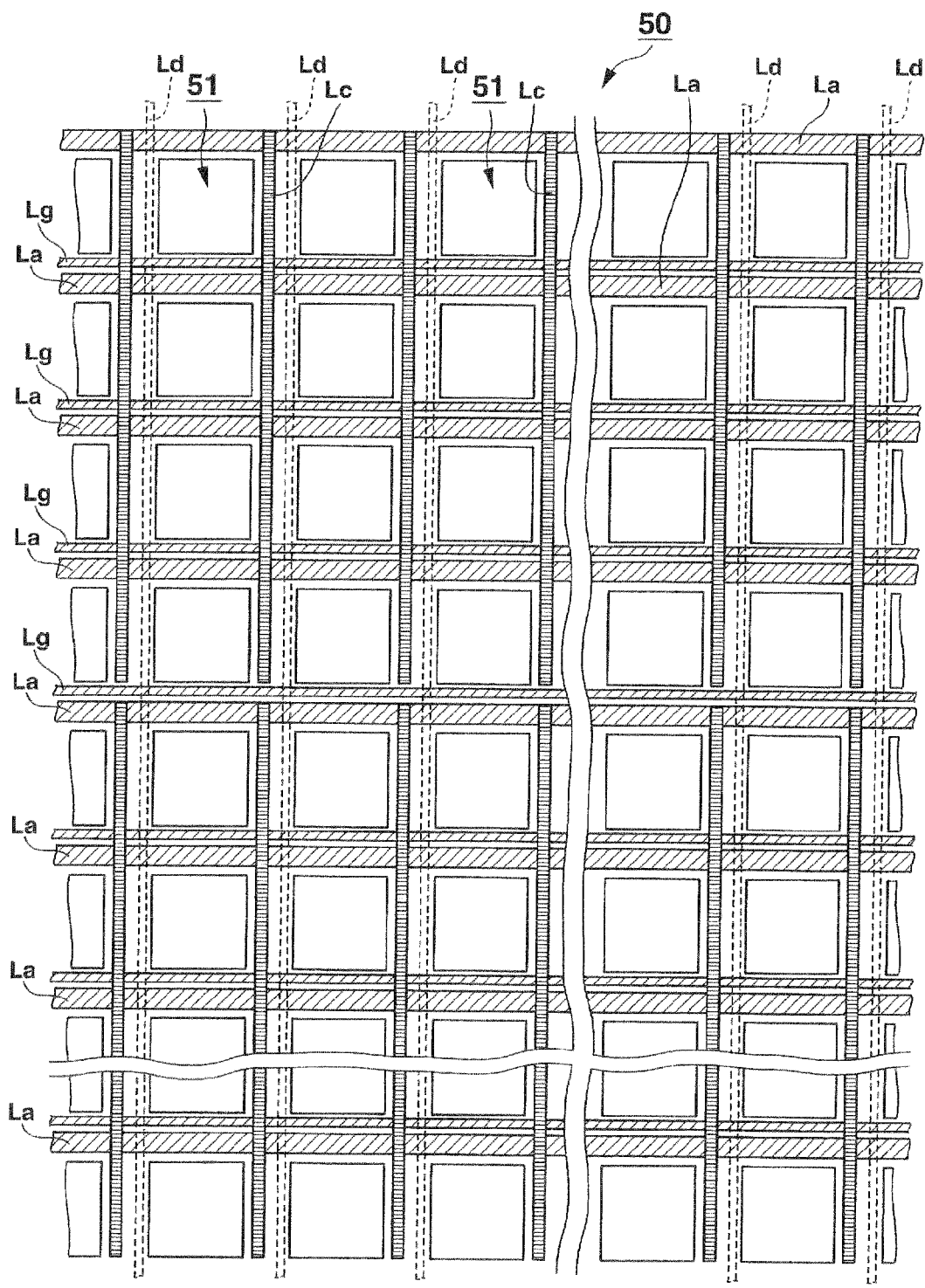
FIG. 12 is a plan view showing an example configuration of a luminescence device according to an embodiment 2.
Figure 13:
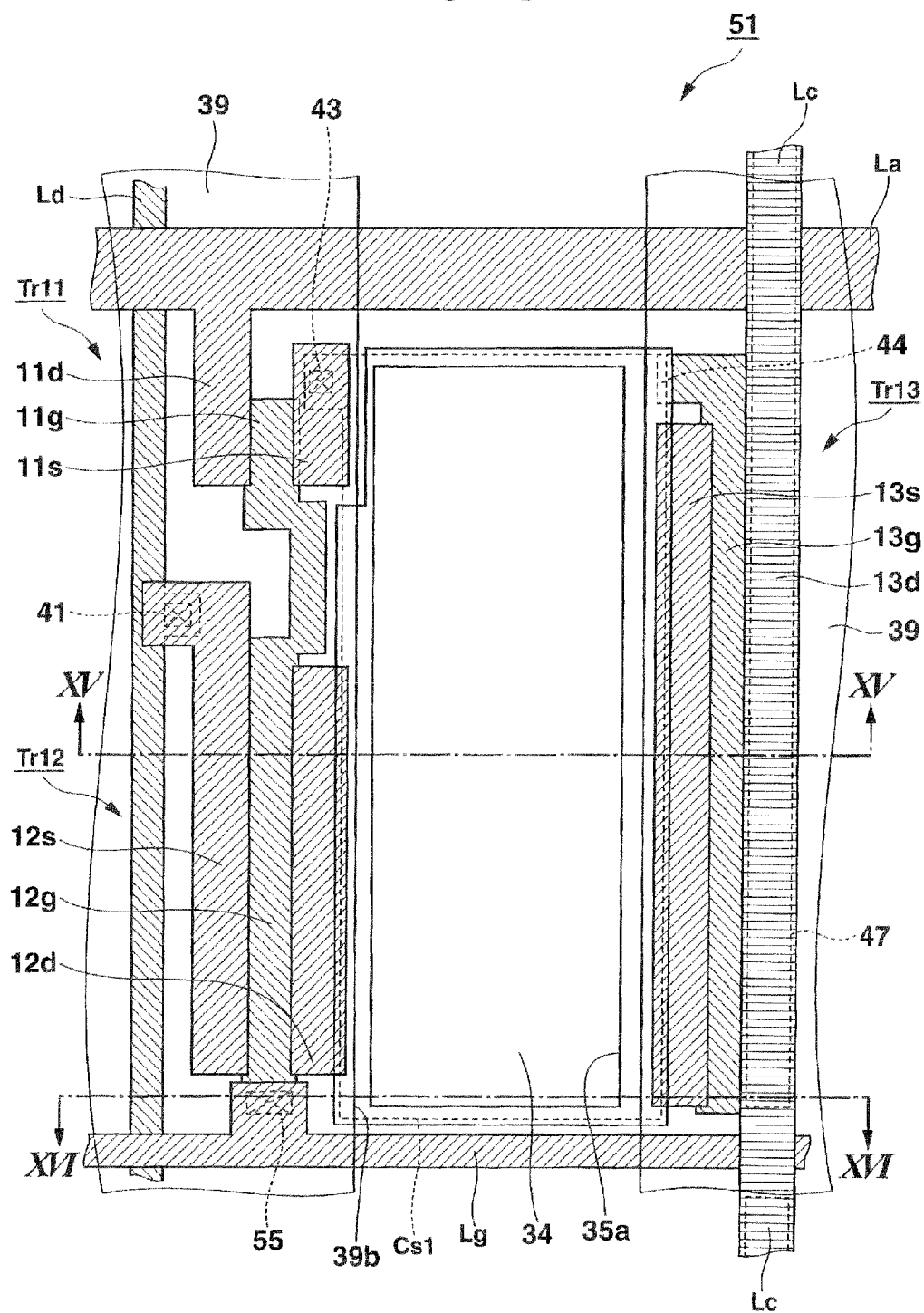
FIG. 13 is a plan view of a pixel according to the embodiment 2.
Figure 14:
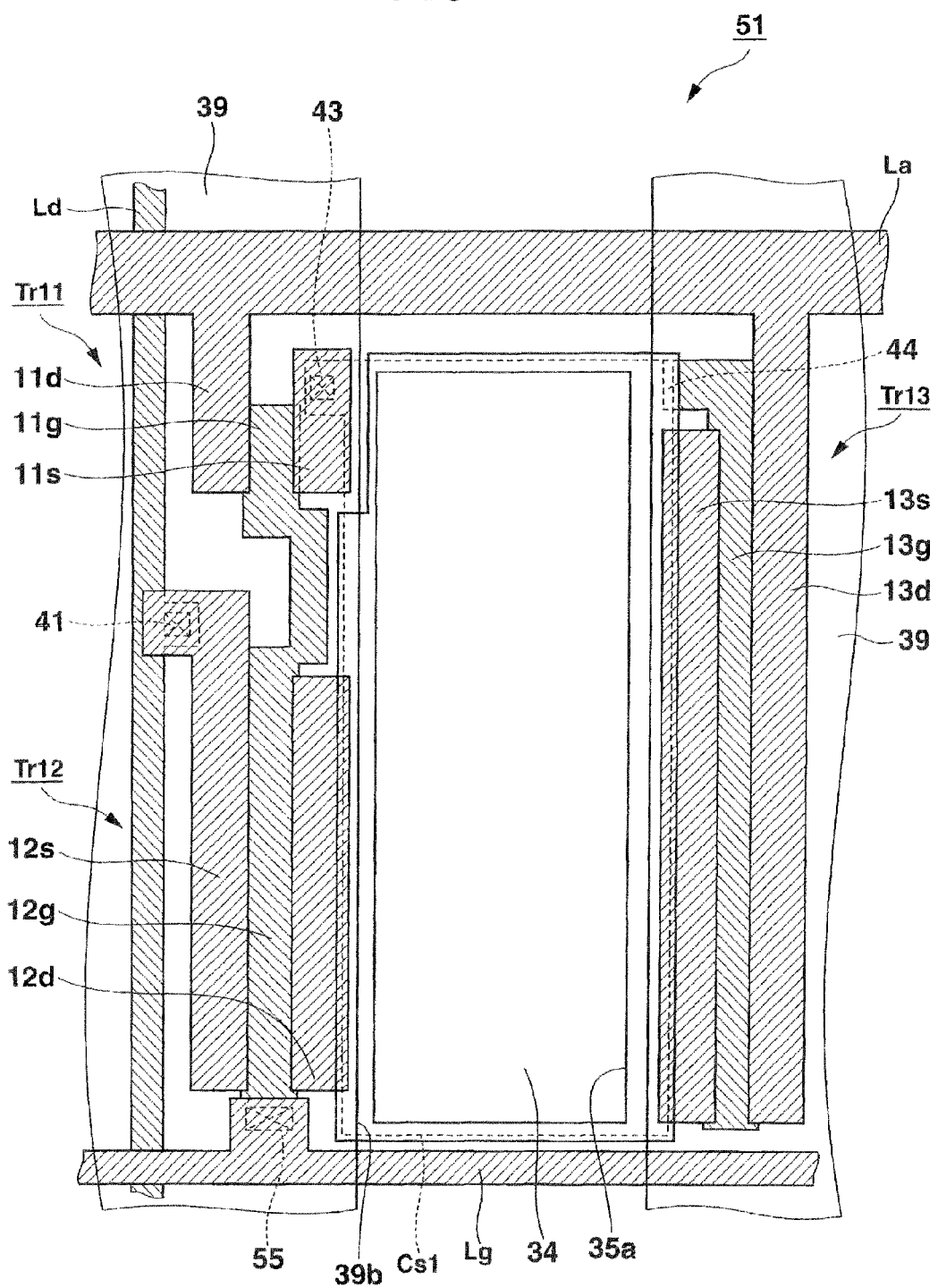
FIG. 14 is a plan view of a pixel without a column-direction connecting line.
Figure 15:
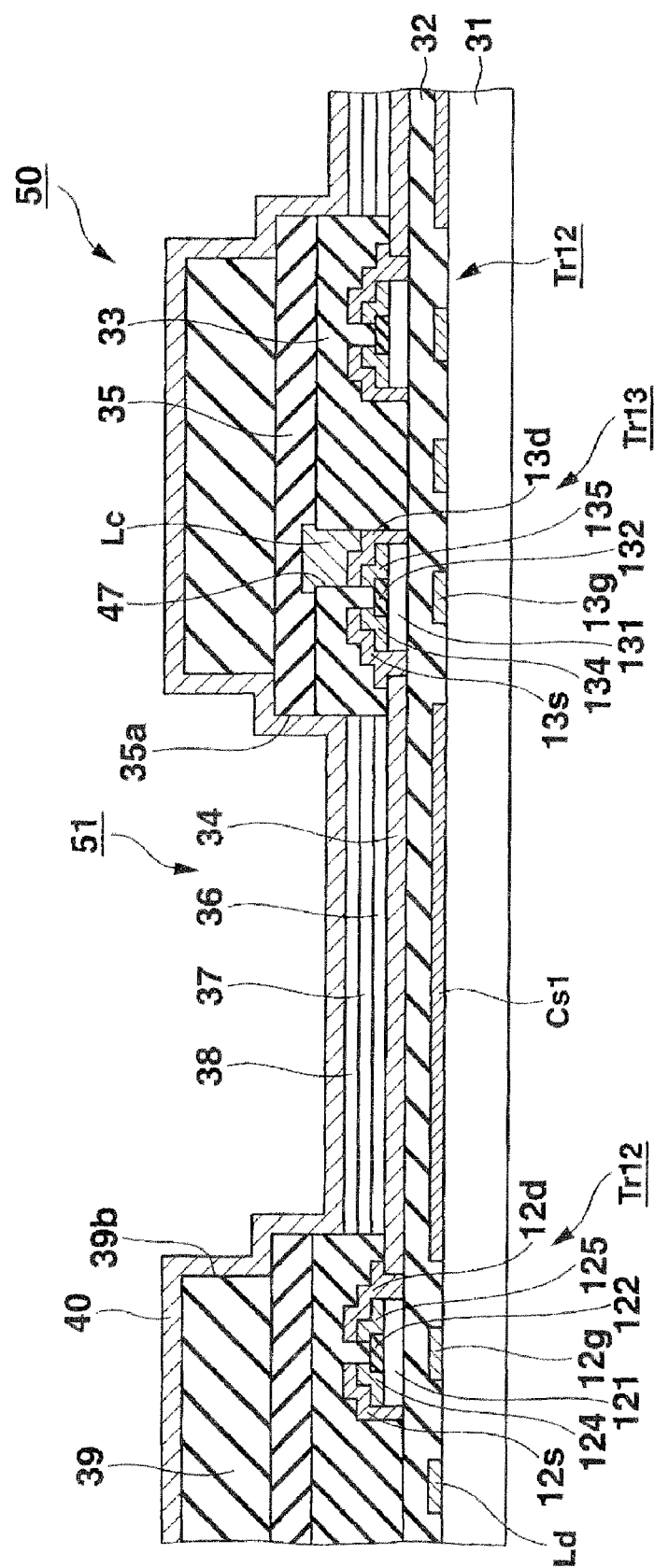
FIG. 15 is a cross section of FIG. 13 taken along a line XV-XV.
Figure 16:
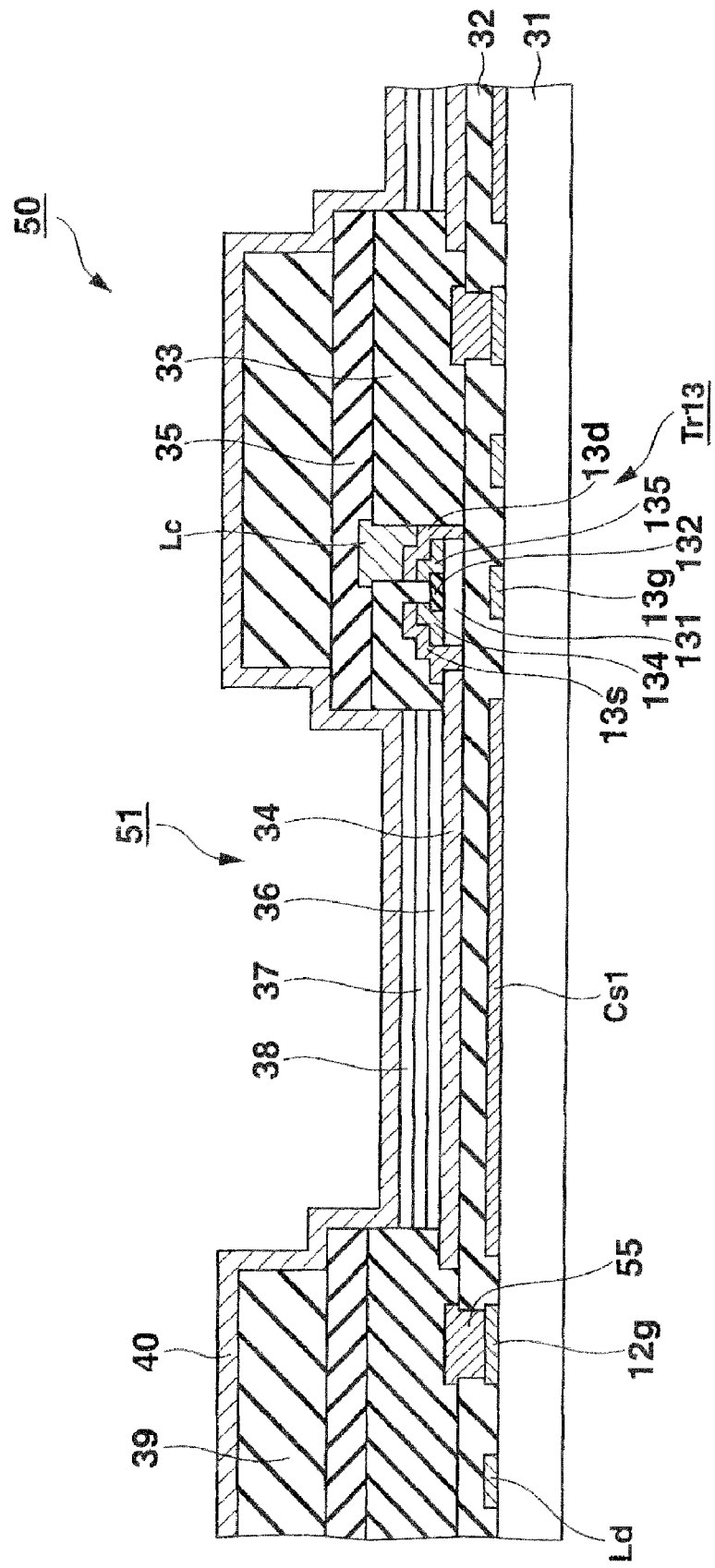
FIG. 16 is a plan view of FIG. 13 taken along a line XVI-XVI.

FIG. 12 is a diagram showing an example configuration of a luminescence device 50 according to the embodiment 2. FIG. 13 is a plan view showing a pixel 51 of the luminescence device according to the embodiment 2. FIG. 14 is a plan view showing the pixel 51 with its column-direction connecting line Lc omitted. FIG. 15 is a cross section of FIG. 13 taken along a line XV-XV. FIG. 16 is a cross section of FIG. 13 taken along a line XVI-XVI.

As shown in FIG. 12, similarly to the embodiment 1, the luminescence device 50 according to the present embodiment includes a pixel substrate 31, on which plural pixel groups each including three pixels 51 having three colors of red (R), green (G), and blue (B) respectively are arranged repeatedly in the row direction (the left-right direction of FIG. 12), and a plurality of pixels that have the same color as one another are arranged in the column direction (the up-down direction of FIG. 12). Similarly to the embodiment 1, each pixel 51 includes an organic EL element 21 that emits light in R, G, or B, and a pixel circuit DS that switches the organic EL element 21 into active operation. Similarly to the embodiment 1, the pixel circuit DS includes a first selector transistor Tr11, a second selector transistor Tr12, a luminescence driving transistor Tr13, a capacitor Cs, and the organic EL element 21. Similarly to the embodiment 1, the organic EL element 21 includes a pixel electrode 34, a partitioning wall 39, an interlayer insulating film 33, an insulating layer 35, a positive hole injecting layer 36, an interlayer 37, a luminescence layer 38, and an opposing electrode 40.

In the pixels 51 according to the present embodiment, as shown in FIG. 12 and FIG. 13, the column-direction connecting line Lc connects the current supply lines La of the pixels 51 that adjoin one another in the column direction. As shown in FIG. 15 and FIG. 16, the column-direction connecting line Lc is formed of a third metal layer that is formed above a source-drain conductive layer. The gate line Lg, the current supply line La, and the drain electrode 13d of the luminescence driving transistor Tr13 are formed of the same source-drain conductive layer. Therefore, the column-direction connecting line Lc is formed to extend along the drain electrode 13d of the luminescence driving transistor Tr13 as shown in FIG. 13, and formed above the drain electrode 13d and the current supply line La to contact them through a contact portion 47, which is a contact hole formed in the interlayer insulating film 33 as shown in FIG. 15. In a region where the column-direction connecting line Lc and the gate line Lg cross each other, they are insulated from each other by the interlayer insulating film 33. In the present embodiment, the column-direction connecting line Lc is formed in a linear shape to extend along the drain electrode 13d. However, since the current supply line La and the drain electrode 13d are equipotential, the column-direction connecting line Lc may also be formed in the row direction along the current supply line La as well as the embodiment 1, to thereby lower the resistance of the current supply line La.

In the present embodiment, as shown in FIG. 16, the gate line Lg and the gate electrode 12g of the second selector transistor Tr12 are connected to each other via a contact portion 55, which is a contact hole formed in the insulating film 32.

Next, a method of manufacturing the luminescence device 50 according to the present embodiment will be explained with reference to FIG. 17A, FIG. 17B, FIG. 18A, and FIG. 18B. The capacitor electrode Cs1 is formed by patterning. Next, a gate conductive film that comprises one selected from at least, for example, an Mo film, a Cr film, an Al film, a Cr/Al stacked film, an AlTi alloy film. AlNdTi alloy film, a MoNb alloy film, etc. is deposited on the pixel substrate 31 by sputtering, vacuum vapor deposition, or the like, and patterned into the shapes of the gate electrodes 12g and 13g of the transistors Tr12 and Tr13 and the data line Ld, as shown in FIG. 17A. The insulating film 32, an amorphous silicon film, and a silicon nitride film are sequentially deposited on the gate electrodes 12g and 13g, the capacitor electrode Cs1, and the data line Ld by CVD or the like, and the silicon nitride film is patterned into the protective insulating films 122 and 132.

Then, an amorphous silicon film that contains an n-type impurity is deposited by CVD or the like and patterned into the ohmic contact layers 124, 125, 134, and 135. The amorphous silicon film formed earlier is patterned into the semiconductor layers 121 and 131 of the transistors Tr12 and Tr13. Next, in the case of a bottom emission type, a transparent conductive film made of ITO or the like is deposited on the insulating film 32 by sputtering, vacuum vapor deposition, or the like. In the case of a top emission type, a light-reflective conductive film and a transparent conductive film made of ITO or the like are deposited on the insulating film 32 by sputtering, vacuum vapor deposition, or the like. The deposited film(s) is/are patterned by photolithography into the pixel electrode 34.

Then, after contact portions 41 and 43 are formed in the insulating film 32 in the form of through holes, a source-drain conductive film that comprises, for example, a Mo film, a Cr film, an Al film, a Cr/Al stacked film, an AlTi alloy film or an AlNdTi alloy film, a MoNb alloy film or the like is deposited by sputtering, vacuum vapor deposition, or the like, and patterned by photolithography into the drain electrodes 12d and 13d, the source electrodes 12s and 13s, the current supply line La, and the gate line Lg. At this time, the source electrode 13s of the luminescence driving transistor Tr13 and the drain electrode 12d of the second selector transistor Tr12 are formed to overlap the pixel electrode 34.

Then, the interlayer insulating film 33 that comprises a silicon nitride film is deposited by CVD or the like to cover the transistors Tr12 and Tr13, etc. as shown in FIG. 17A.

An opening that matches the column-direction connecting line Lc is formed by photolithography or the like in the interlayer insulating film 33 except a portion of the interlayer insulating film 33 that is above the gate line Lg. Then, the third metal layer that comprises one selected from at least, for example, a Mo film, a Cr film, an Al film, a Cr/Al stacked film, an AlTi alloy film, an AlNdTi alloy film, a MoNb alloy film, etc. is deposited by vacuum vapor deposition or sputtering. Then, the third metal layer is patterned by photolithography into the column-direction connecting line Lc as shown in FIG. 17B. The column-direction connecting line Lc is formed to contact the drain electrode 13d and the current supply line La but to be insulated from the gate line Lg by the interlayer insulating film 33.

Then, the insulating layer 35 that comprises a silicon nitride film or the like is deposited to cover the column-direction connecting line Lc. Then, the aperture 35a from which the pixel electrode 34 is exposed is formed in the insulating layer 35 and the interlayer insulating film 33.

Figure 18A:
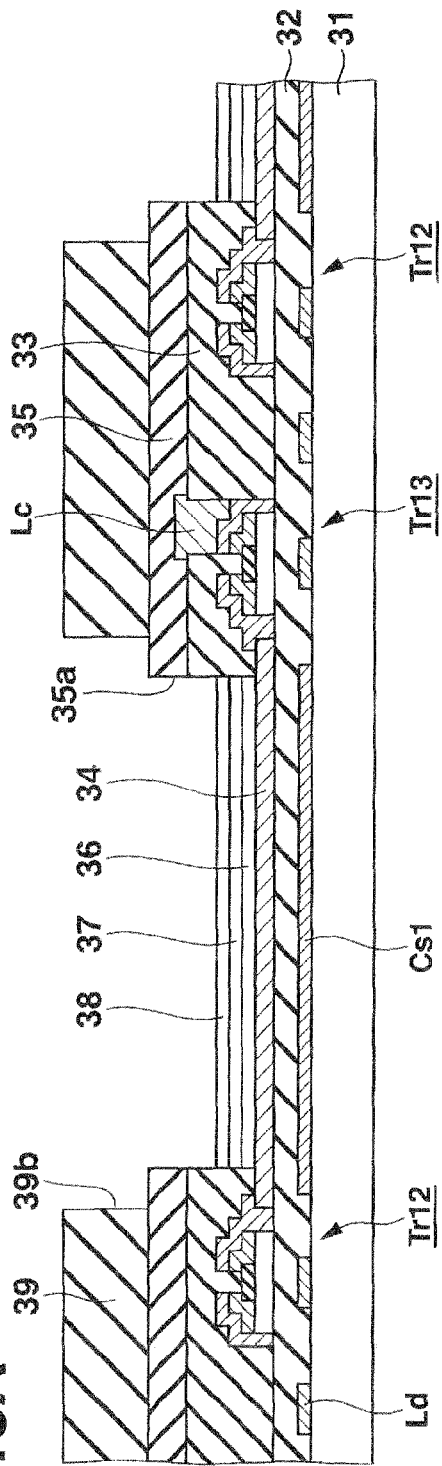
FIGS. 18A and 18B are diagrams showing the method of manufacturing the luminescence device according to the embodiment 2.

Next, photosensitive polyimide is coated so as to cover the interlayer insulating film 33 and the insulating layer 35, and patterned by exposure, development, and burning via a mask that matches the shape of the partitioning wall 39 to thereby form the partitioning wall 39 as shown in FIG. 18A.

Then, similarly to the embodiment 1, the positive hole injecting layer 36 is formed above the pixel electrode 34 that is confined in the aperture 35a by a nozzle printing device, an ink jetting device, or a rolling printer. Other than by the wet film formation manner described above, the positive hole injecting layer 36 may be formed by vapor deposition. Then, the interlayer 37 is formed above the positive hole injecting layer 36, and the luminescence layer 38 is formed above the interlayer 37.

In the case of a bottom emission type, the opposing electrode 40 to be formed on the pixel substrate 31 on which layers up to the luminescence layer 38 have been faulted is deposited by vacuum vapor deposition or sputtering as a dual-layered structure that includes: a layer that comprises a low-work-function material such as Li, Mg, Ca, Ba, etc.; and a light-reflective conductive layer made of Al or the like. In the case of a top emission type, the opposing electrode 40 is formed as a transparent stacked structure that includes: a light-transmissive low-work-function layer that comprises a low-work-function material such as Li, Mg, Ca, Ba, etc. and has a very small film thickness of about 10 nm; and a light-transmissive conductive layer that is formed above that layer, made of ITO or the like, and has a film thickness of about 100 nm to 200 nm.

Next, a sealing resin that comprises an ultraviolet curable resin or a thermosetting resin is coated on a portion of the pixel substrate 31 that is outside the display region on which the plurality of pixels 51 have been formed, and the pixel substrate 31 and a sealing substrate are joined together. Then, the sealing resin is cured by ultraviolet or heat to secure the pixel substrate 31 and the sealing substrate together.

Figure 18B:
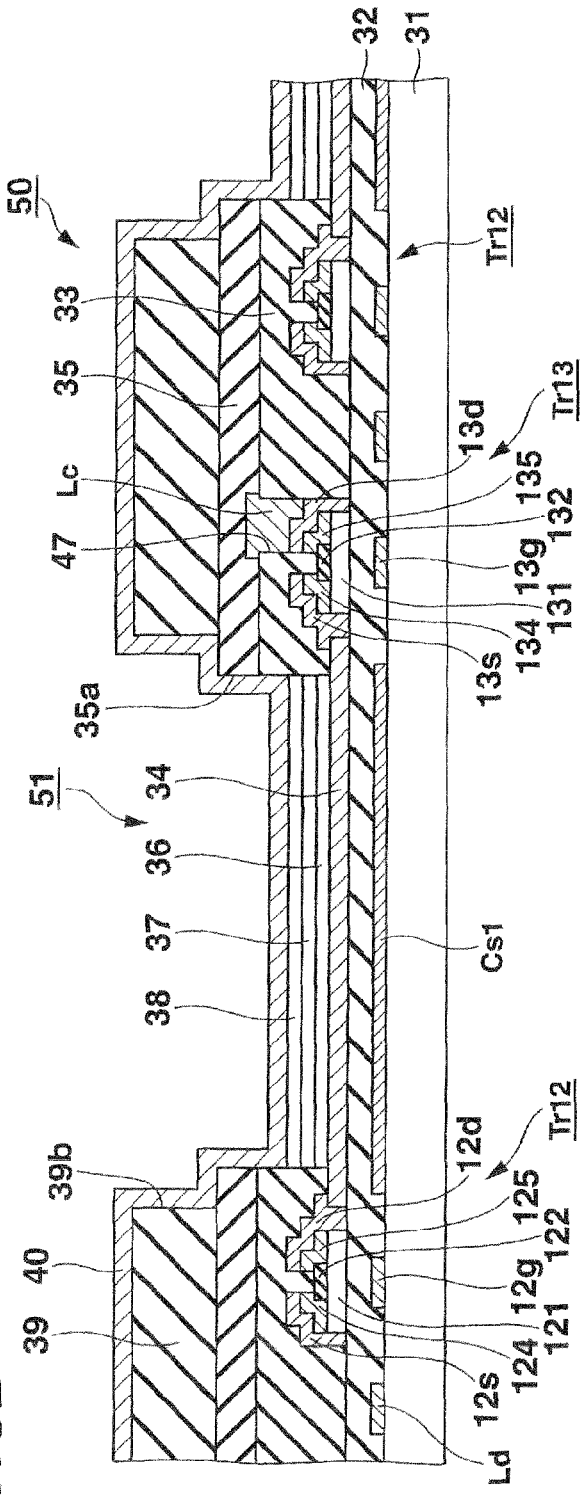

Through these steps, the luminescence device 50 is manufactured as shown in FIG. 18B.

As described above, in the present embodiment, the column-direction connecting line Lc is formed in a manner to connect the drain electrode 13d of the luminescence driving transistor Tr13 of a given pixel 51 to the drain electrodes 13d of the luminescence driving transistors Tr13 of other pixels 51 that adjoin that pixel 51 in the column direction. Therefore, it is possible to connect a plurality of current supply lines La to one another and to suppress voltage decrease along the current supply lines La finely.

Embodiment 3

A luminescence device 60 according to the embodiment 3 will be explained with reference to the drawings. In the embodiment 1 and the embodiment 2 described above, the current supply line La, the data line Ld, and the gate line Lg are formed of the gate conductive layer, the source-drain conductive layer, and the third metal layer. The embodiment 3 is different from these embodiments in that the these lines are formed of only two layers, namely, the gate conductive layer and the source-drain conductive layer. Any members that are the same as those in the embodiments described above will be denoted by the same reference numerals as those members and will not be explained in detail.

Figure 19:
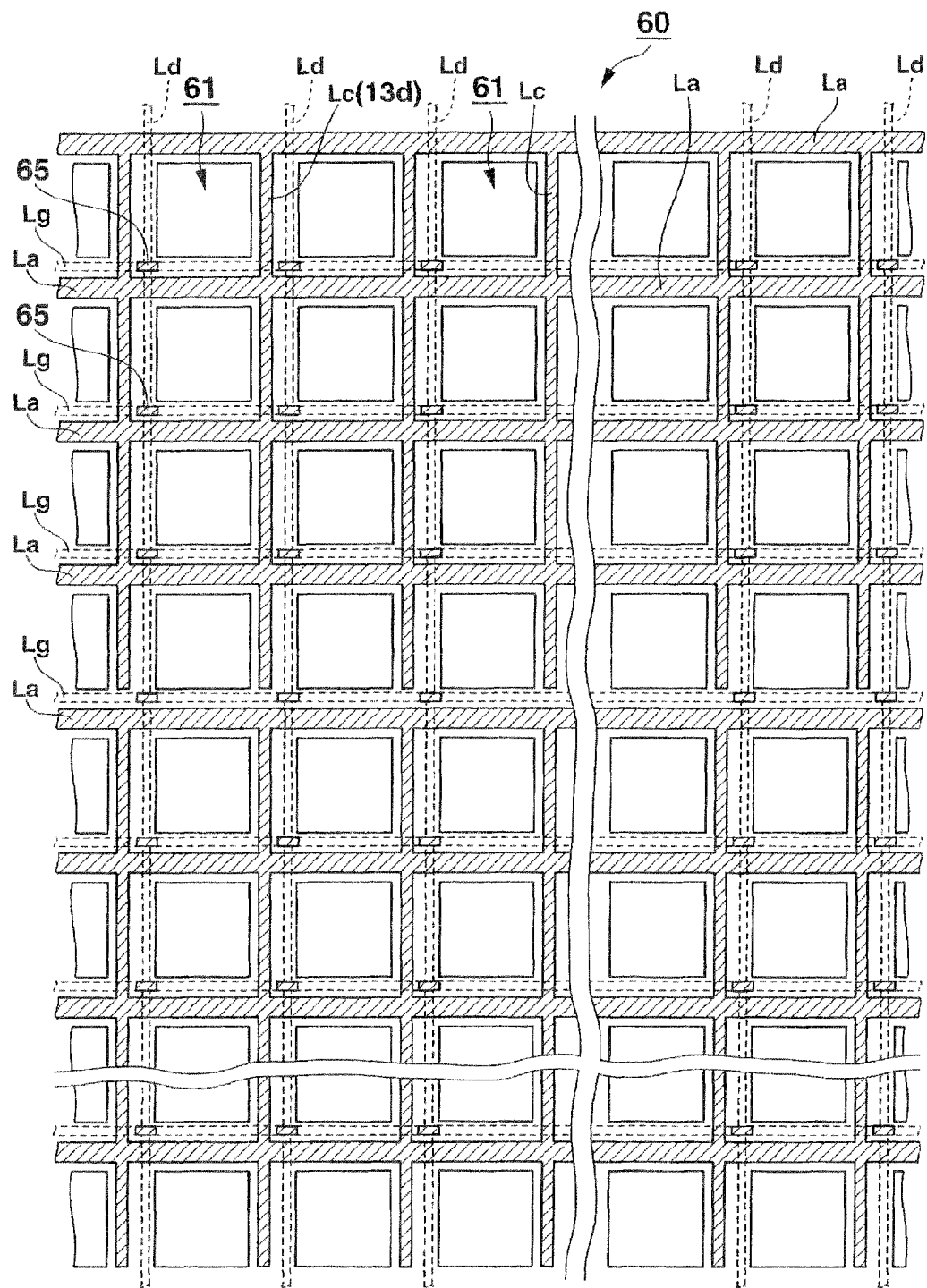
FIG. 19 is a plan view showing an example configuration of a luminescence device according to an embodiment 3.
Figure 20:
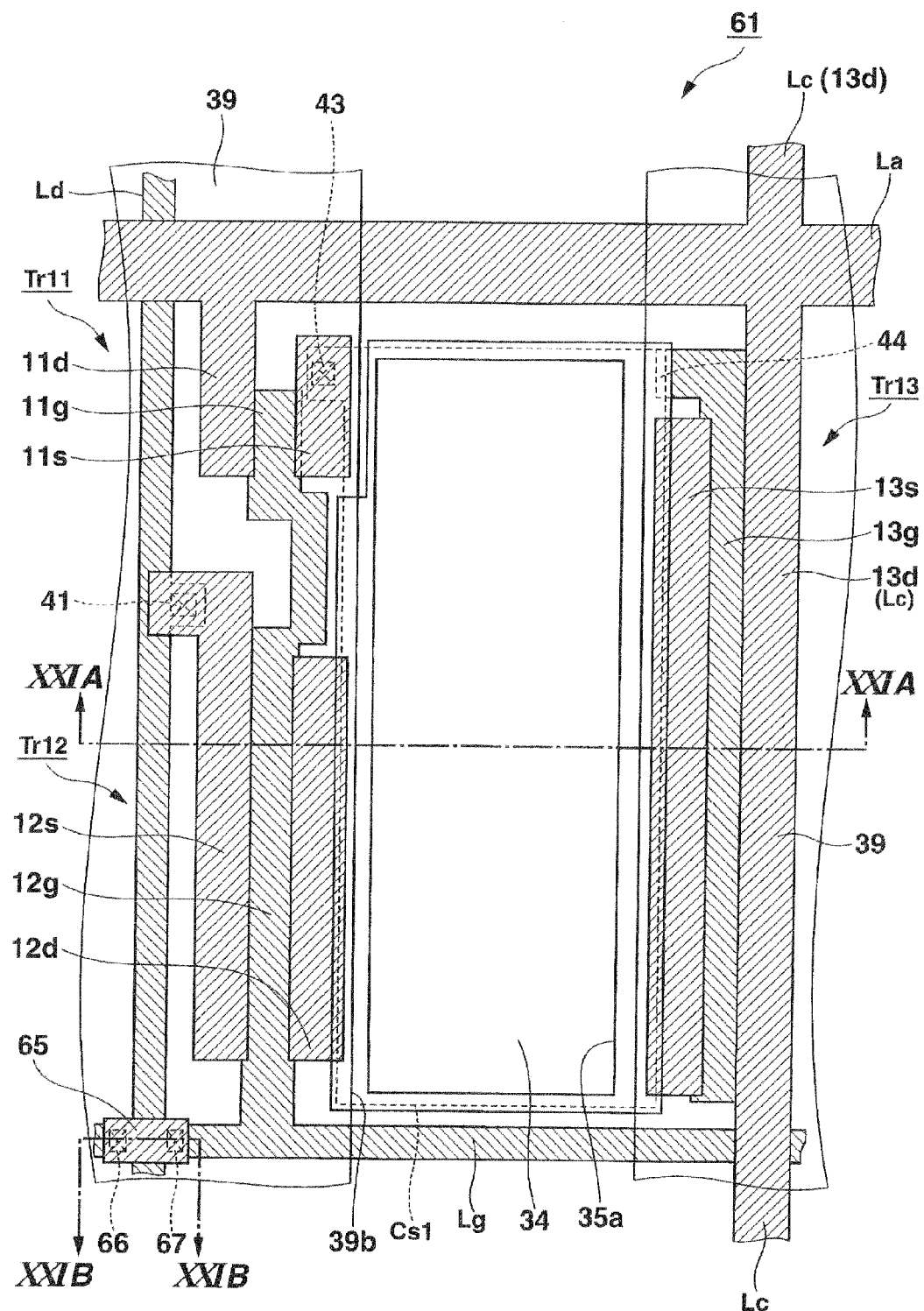
FIG. 20 is a plan view of a pixel according to the embodiment 3.
Figure 21A:
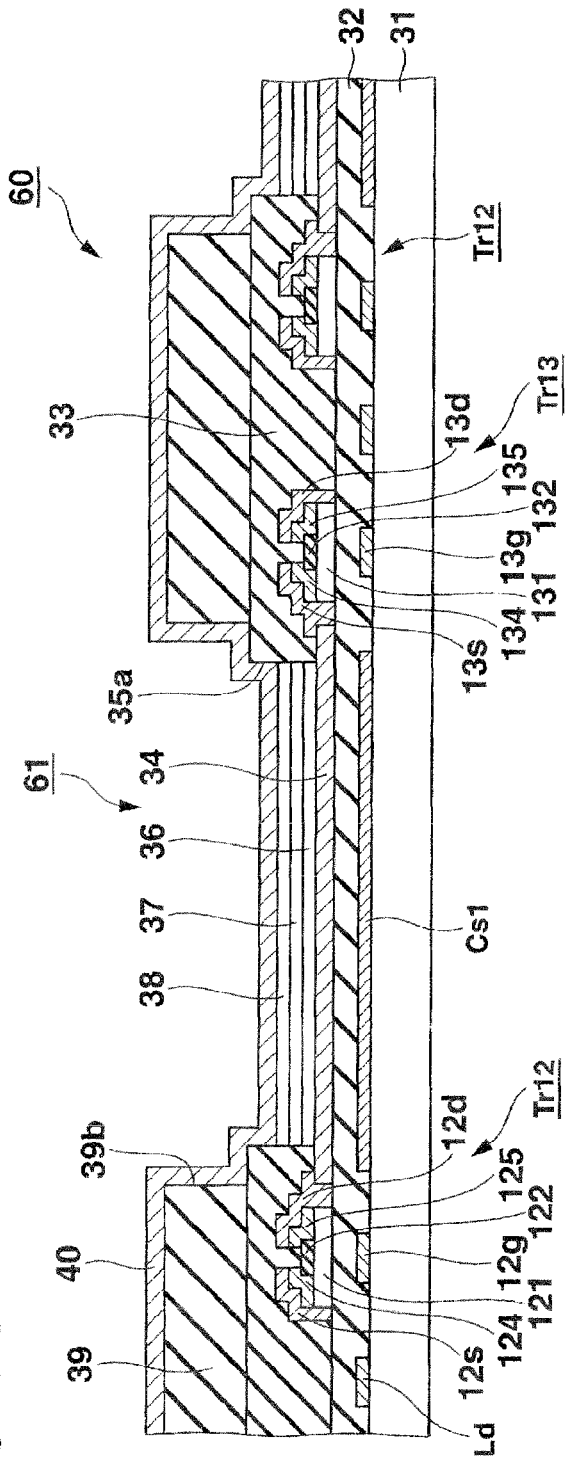
FIG. 21A is a cross section of FIG. 20 taken along a line XXIA-XXIA.
Figure 21B:
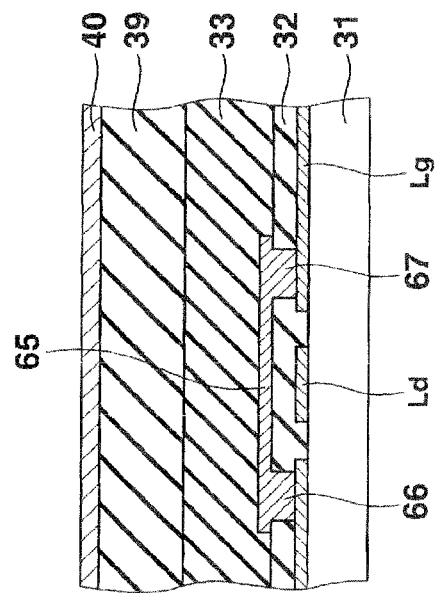
FIG. 21B is a cross section of FIG. 20 taken along a line XXIB-XXIB.

FIG. 19 is a diagram showing a configuration example of the luminescence device 60 according to the embodiment 3. FIG. 20 is a plan view showing a pixel 61 of the luminescence device according to the embodiment 3. FIG. 21A is a cross section of FIG. 20 taken along a line XXIA-XXIA. FIG. 21B is a cross section of FIG. 20 taken along a line XXIB-XXIB.

Similarly to the embodiment 1, the luminescence device 60 according to the present embodiment includes a pixel substrate 31, on which plural pixel groups each including three pixels 61 having three colors of red (R), green (G), and blue (B) respectively are arranged repeatedly in the row direction (the left-right direction of FIG. 20), and a plurality of pixels that have the same color as one another are arranged in the column direction (the up-down direction of FIG. 20). Each pixel 61 includes an organic EL element 21 that emits light in R, G, or B, and a pixel circuit DS that switches the organic EL element 21 into active operation. Similarly to the embodiment 1, the pixel circuit DS includes a first selector transistor Tr11, a second selector transistor Tr12, a luminescence driving transistor Tr13, a capacitor Cs, and the organic EL element 21. Similarly to the embodiment 1, the organic EL element 21 includes a pixel electrode 34, an interlayer insulating film 33, a positive hole injecting layer 36, an interlayer 37, a luminescence layer 38, a partitioning wall 39, and an opposing electrode 40.

In the present embodiment, as shown in FIG. 20, the drain electrode 13d of the luminescence driving transistor Tr13 is elongated in the column direction to connect to the drain electrode 13d of an adjoining pixel 61. In this way, the drain electrodes 13d function as the column-direction connecting line Lc. Since the drain electrodes 13d are formed to elongate over a plurality of pixels, it is necessary to arrange that the column-direction connecting line Lc (drain electrodes 13d) not interfere with the gate line Lg. Therefore, in the present embodiment, the gate line Lg is formed of the gate conductive layer that is the same layer as that that forms the data line Ld and that is formed below the insulating film 32. In a case where the gate line Lg is funned of the gate conductive layer, the gate line Lg and the data line Ld cross each other at a region shown in the lower left portion of FIG. 20, Therefore, as shown in FIG. 21B, the gate line Lg and the data line Ld are insulated from each other by means of contact portions 66 and 67 that are formed in the insulating film 32 and a bypass line 65 that is formed of the source-drain conductive layer to make the gate line Lg rise above the insulating film 3 bypass the gate line Ld.

Next, a method of manufacturing the luminescence device 60 according to the present embodiment will be explained.

First, the capacitor electrode Cs1 is formed by patterning. Next, a gate conductive film that comprises at least one of for example, an Mo film, a Cr film, an Al film, a Cr/Al stacked film, an AlTi alloy film, an AlNdTi alloy film, a MoNb alloy film, etc. is deposited on the pixel substrate 31 by sputtering, vacuum vapor deposition, or the like, and patterned into the shapes of the gate electrodes 12g and 13g of the transistors Tr12 and Tr13, the data line Ld, and the gate line Lg. Then, the insulating film 32, an amorphous silicon film, and a silicon nitride film are sequentially deposited on the gate electrodes 12g and 13g, the capacitor electrode Cs1, the data line Ld, and the gate line Lg by CVD or the like, and the silicon nitride film is patterned into the protective insulating films 122 and 132.

Then, an amorphous silicon film that contains an n-type impurity is deposited by CVD or the like and patterned into the ohmic contact layers 124, 125, 134, and 135. The amorphous silicon film formed earlier is patterned into the semiconductor layers 121 and 131 of the transistors Tr12 and Tr13. Next, in the case of a bottom emission type, a transparent conductive film made of ITO or the like is deposited on the insulating film 32 by sputtering, vacuum vapor deposition, or the like. In the case of a top emission type, a light-reflective conductive film and a transparent conductive film made of ITO or the like are deposited on the insulating film 32 by sputtering, vacuum vapor deposition, or the like. The deposited film(s) is/are patterned by photolithography into the pixel electrode 34.

Then, after through holes matching the contact portions 66 and 67 are formed in the insulating film 32 at predetermined regions of the insulating film 32, a source-drain conductive layer that comprises, for example, a Mo film, a Cr film, an Al film, a Cr/Al stacked film, an AlTi alloy film or an AlNdTi alloy film, a MoNb alloy film or the like is deposited by sputtering, vacuum vapor deposition, or the like, and patterned by photolithography. Whereby, the contact portions 66 and 67, the bypass line 65, the drain electrodes 12d and 13d, the source electrodes 12s and 13s, and the current supply line La are formed. At this time, the source electrode 13s of the luminescence driving transistor Tr13 and the drain electrode 12d of the second selector transistor Tr12 are formed to overlap the pixel electrode 34.

Then, the interlayer insulating film 33 that comprises a silicon nitride film is deposited by CVD or the like to cover the transistors Tr12 and Tr13, etc. Then, the aperture 35a is formed in the interlayer insulating film 33 by photolithography or the like to expose the pixel electrode 34.

Next, photosensitive polyimide is coated so as to cover the interlayer insulating film 33 and patterned by exposure, development, and burning via a mask that matches the shape of the partitioning wall 39 to thereby form the partitioning wall 39. Then, similarly to the embodiment 1, the positive hole injecting layer 36 is formed above the pixel electrode 34 that is confined in the aperture 35a. Then, the interlayer 37 is formed above the positive hole injecting layer 36, and the luminescence layer 38 is formed above the interlayer 37.

In the case of a bottom emission type, the opposing electrode 40 to be formed on the pixel substrate 31 on which layers up to the luminescence layer 38 have been formed is deposited by vacuum vapor deposition or sputtering as a dual-layered structure that includes: a layer that comprises a low-work-function material such as Li, Mg, Ca, Ba, etc.; and a light-reflective conductive layer made of Al or the like. In the case of a top emission type, the opposing electrode 40 is formed as a transparent stacked structure that includes: a light-transmissive low-work-function layer that comprises a low-work-function material such as Li, Mg, Cu, Ba, etc. and has a very small film thickness of about 10 nm; and a light-transmissive conductive layer that is formed above that layer, made of ITO or the like, and has a film thickness of about 100 nm to 200 nm.

Next, a sealing resin that comprises an ultraviolet curable resin or a thermosetting resin is coated on a portion of the pixel substrate 31 that is outside the display region on which the plurality of pixels 61 have been formed, and the pixel substrate 31 and a sealing substrate are joined together. Then, the sealing resin is cured by ultraviolet or heat to secure the pixel substrate 31 and the sealing substrate together.

Through these steps, the luminescence device 60 is manufactured.

As described above, in the present embodiment, the drain electrode 13d of the luminescence driving transistor Tr13 of each pixel 61 is formed to elongate to connect to the drain electrodes 13d of the luminescence driving transistors Tr13 of the pixels 61 that adjoin that pixel 61 in the column direction to function as the column-direction connecting line Lc. This makes is possible to finely suppress voltage decrease along the current supply lines La. Further, in the present embodiment, the gate line Lg is formed of the gate conductive layer that forms the data line Ld, in a manner that the gate line Lg bypasses the date line Ld at the region where the gate line Lg and the data line Ld cross each other, by means of the bypass line 65 that is formed of the source-drain conductive layer. Where the gate line Lg uses a bypass line in this manner, two metal layers, namely the gate conductive layer and the source-drain conductive layers are only necessary for the current supply lines La to be connected by the column-direction connecting line Lc, and voltage decrease along the current supply lines La can be finely suppressed.

Figure 22:
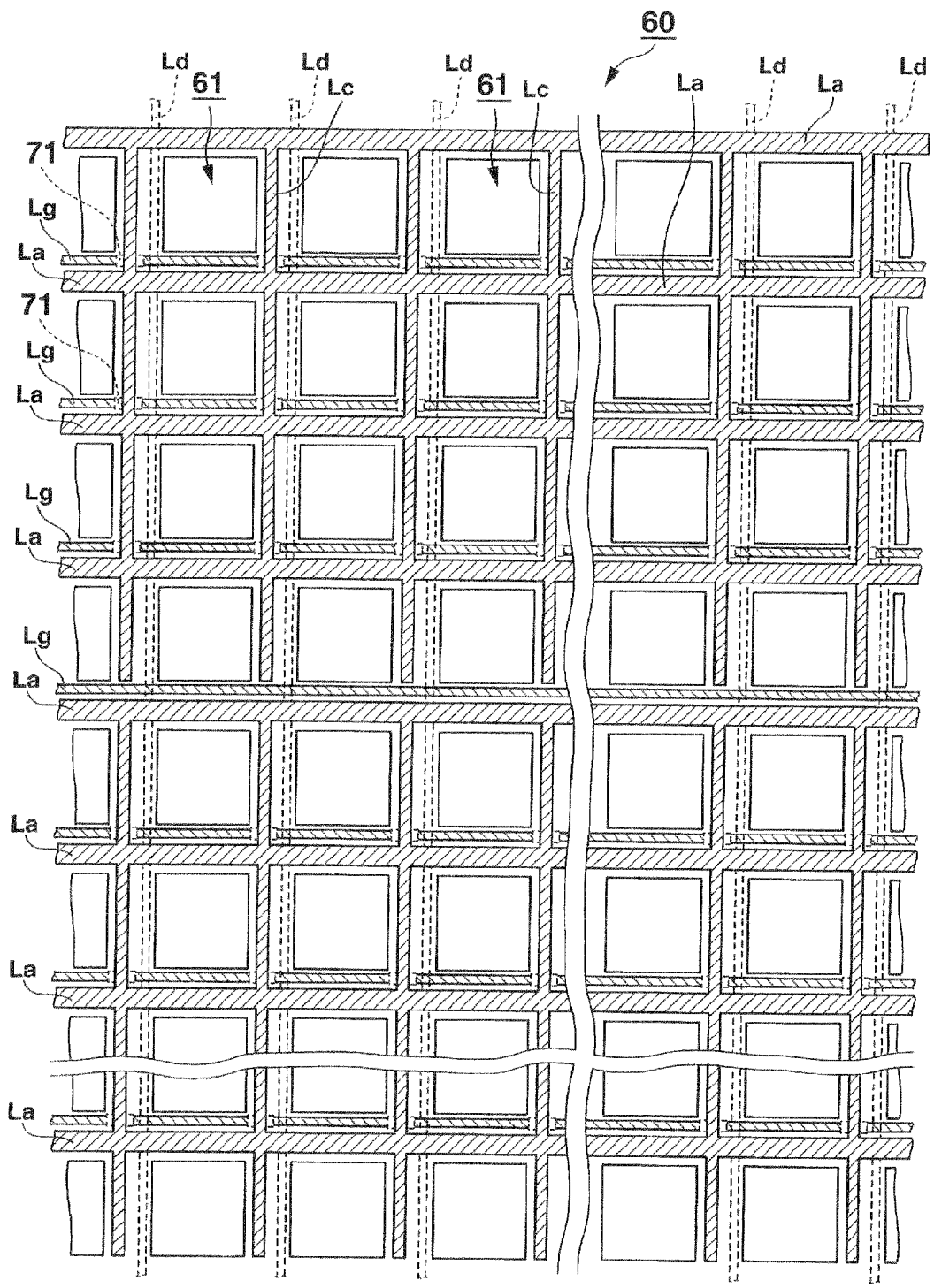
FIG. 22 is a diagram showing a modification example.

In the embodiment 3 described above, the gate line Lg is formed of the gate conductive layer. Not being limited to this, as shown in, for example, FIG. 22, the gate line Lg may be formed of the source-drain conductive layer as well as the embodiment 2 described above, and the column-direction connecting line Lc and the current supply line La may be formed of the source-drain conductive layer. In this case, the column-direction connecting line Lc and the gate line Lg cross each other at a region in the lower right portion of FIG. 20. Therefore, the gate line Lg may be broken near the column-direction connecting line Lc, and similarly to the embodiment 3, ends of the gate line Lg that are located on the left and right sides of the column-direction connecting line Lc may be connected, via a contact portion that is a contact hole formed in the insulating film 32, to a bypass line 71 that is formed by patterning the gate conductive layer.

Figure 23:
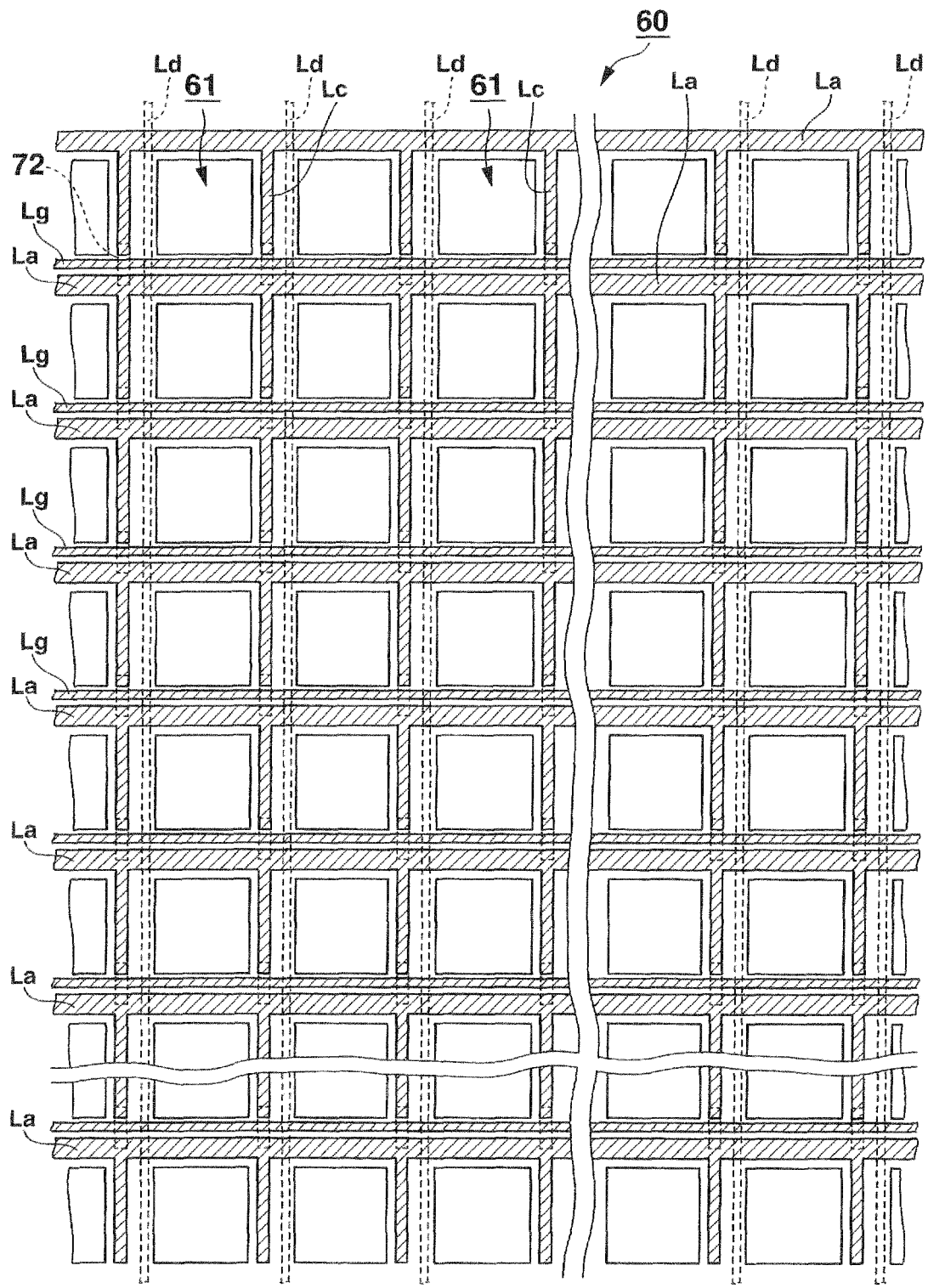
FIG. 23 is a diagram showing a modification example.

The data line Ld and the column-direction connecting line Lc are directly related to the transmission of a display signal that controls the luminescence of the organic EL element, and hence it is more preferable if voltage decrease does not occur along these lines. However, if the organic EL element is not influenced greatly when emitting light, not the gate line Lg but the data line Ld may use a bypass line in the embodiment 3, or as shown in FIG. 23, the column-direction connecting line Lc that is formed of the source-drain conductive layer may be led, via a contact portion that is a contact hole fanned in the insulating film 32, to a bypass line 72 that is formed of the gate conductive layer.

Embodiment 4

Figure 24:
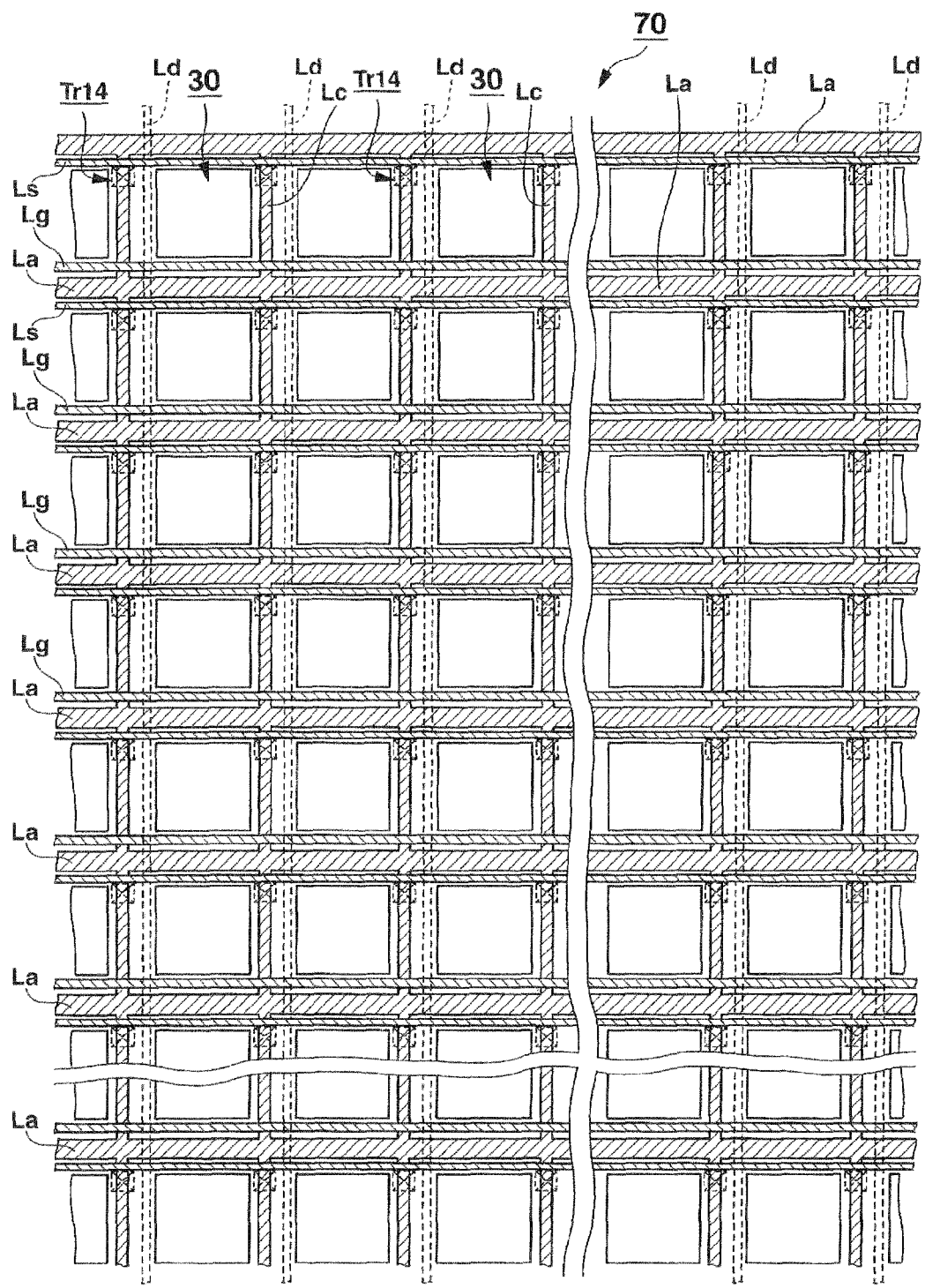
FIG. 24 is a plan view showing an example configuration of a luminescence device according to an embodiment 4.
Figure 25:
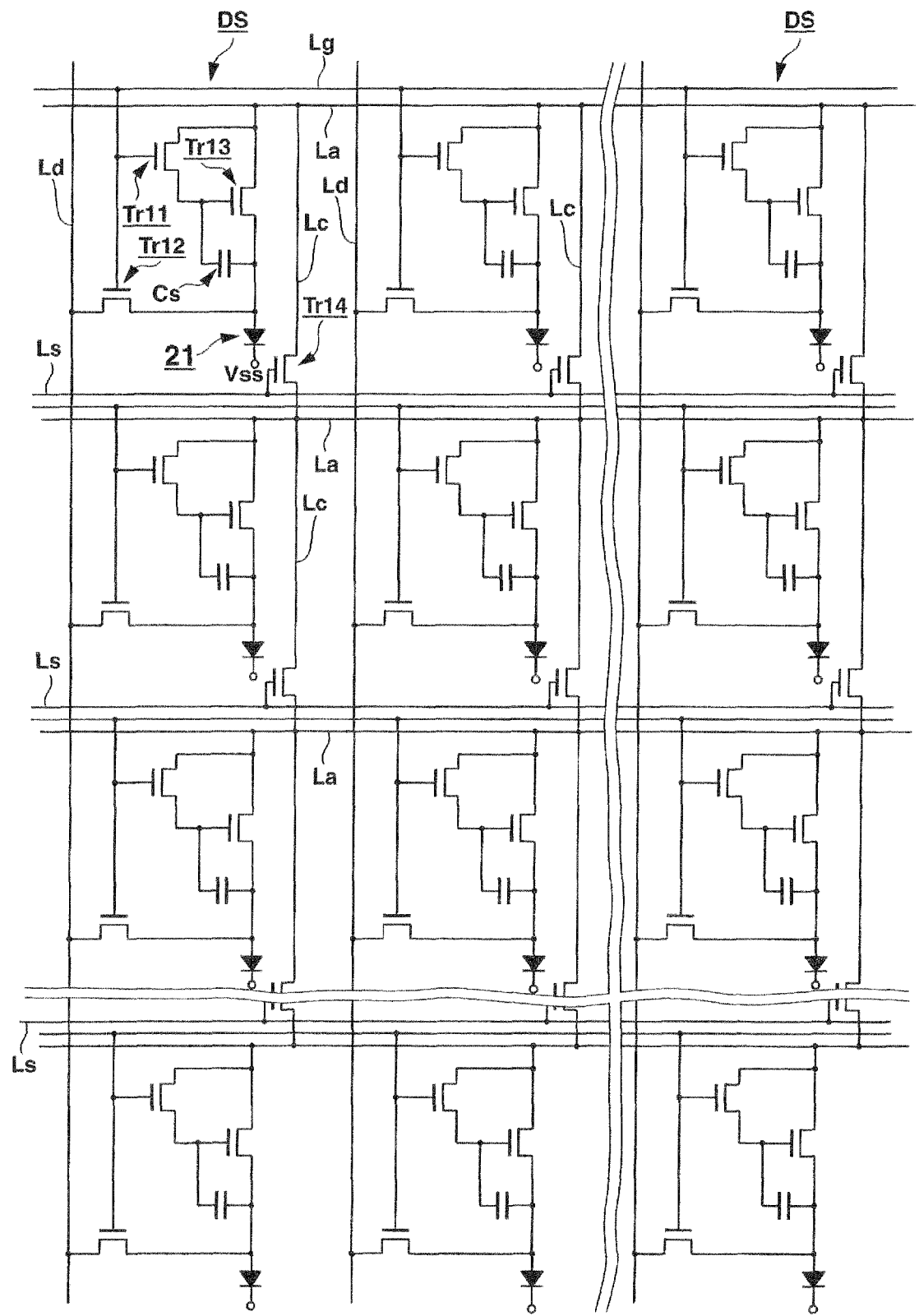
FIG. 25 is an equivalent circuit diagram showing a drive circuit of a pixel.
Figure 26:
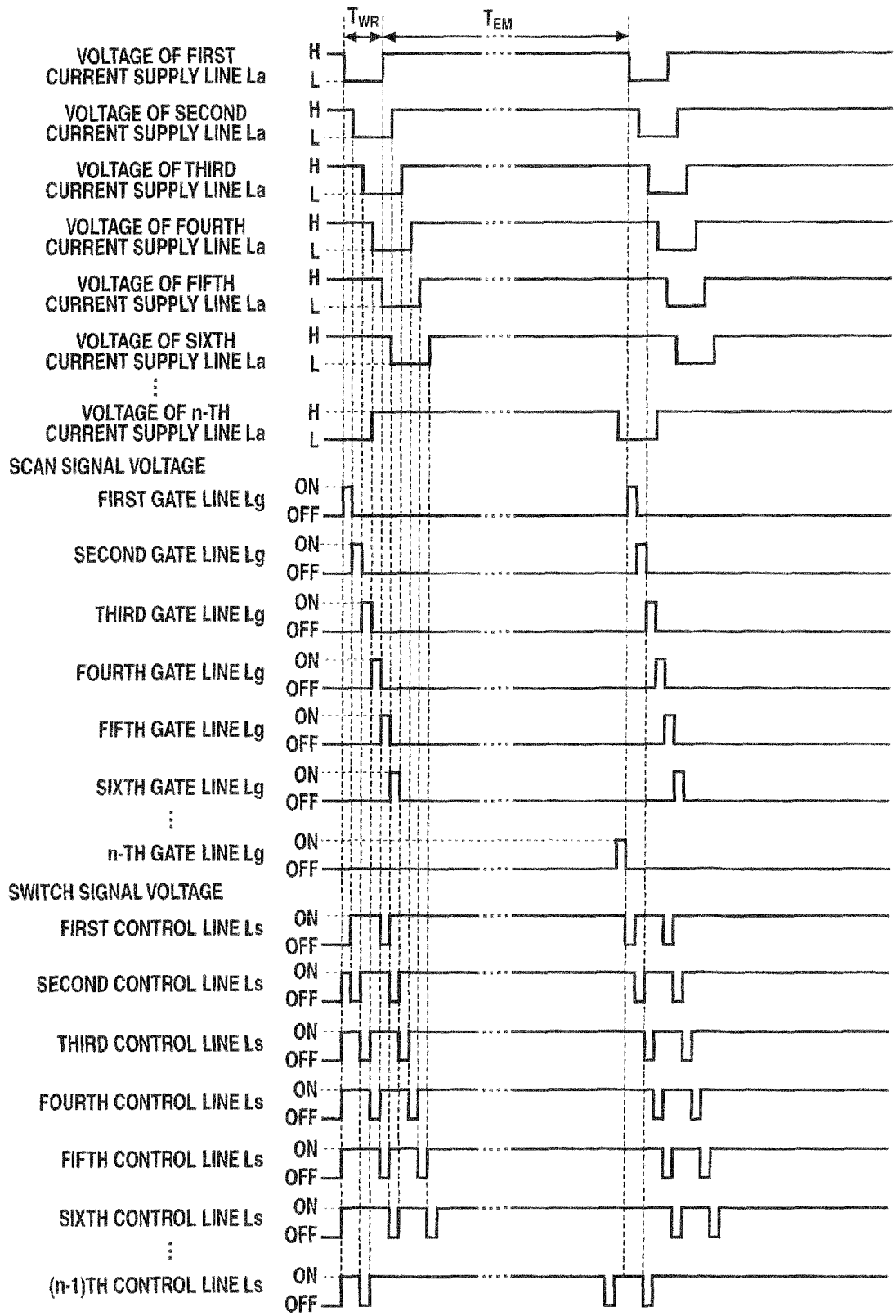
FIG. 26 is a timing chart showing an operation.

A luminescence device 70 according to the embodiment 4 will be explained with reference to FIG. 24 to FIG. 26. The embodiment 4 is different from the embodiment 1 to the embodiment 3 in that each column-direction connecting line Lc that extends between adjoining rows is provided with a switch transistor Tr14 as a switching element. Furthermore, the current supply lines La are not divided by the unit of rows (where "d" is an integer equal to or greater than 2), but all the current supply lines La are connected via the column-direction connecting lines Lc between the rows and the switch transistors Tr14. Any members that are the same as those of the embodiments described above will be denoted by the same reference numerals as those members and will not be explained in detail.

Each switch transistor Tr14 on the i-th row has its drain electrode connected to the column-direction connecting line Lc that is connected to the current supply line La of the i-th row, its source electrode connected to the column-direction connecting line Lc that is connected to the current supply line La of the (i+1)th row, and its gate electrode connected to a control line Ls of the i-th row. That is, in a case where there exist "n" rows of pixels, there are (n-1) control lines Ls. Therefore, when a switch signal voltage of an on level ON is applied to the control line Ls of the i-th row, the current supply line La of the i-th row and the current supply line La of the (i+1)th row become electrically continuous. When a switch signal voltage of an off level OFF is applied to the control line Ls of the i-th row, the current supply line La of the i-th row and the current supply line La of the (i+1)th row become electrically discontinuous. Here, in order that the current supply lines La of each rows may be connected to one another (where "d" is an integer equal to or greater than 2), as shown in FIG. 26, the following three conditions are required in a case where a scan signal voltage of an on level ON is applied to the gate line Lg of the i-th row. A switch signal voltage of the off level OFF is applied to the control line Ls of the i-th row to make the current supply line La of the i-th row electrically discontinuous from the current supply line La of the (i+1)th row. A switch signal voltage of the off level OFF is applied to the control line Ls of the (i-d)th row to make the current supply line La of the (i-d)th row electrically discontinuous from the current supply line La of the (i-d-1)th row. A switch signal voltage of the on level ON is applied to all the control lines Ls except those of the i-th and (i-d)th rows.

When a scan signal voltage of the on level ON is applied to the gate line Lg of the i-th row, the voltage applied to the current supply line La of the i-th row switches from a high level H to a low level L. The power supply or the current supply driver is set to keep the voltage of the low level L applied to the current supply line La of the i-th row until a scan signal voltage applied to the gate line Lg of the (i+d-1)th row switches from the on level ON to the off level OFF. Further, the power supply or the current supply driver is set to switch the voltage applied to the current supply line La of the i-th row from the low level L to the high level H when a scan signal voltage applied to the gate line La of the (i+d)th row switches from the off level OFF to the on level ON.

In other words, when a scan signal voltage of the on level ON is applied to the gate line Lg of the i-th row, a switch signal voltage of the on level ON is applied to the control lines Ls of the (i-d+1)th to (i-1)th rows to switch on (d-1) switch transistors Tr14 that are provided between the (i-d+1)th row and the i-th row. This makes the column-direction connecting lines Lc provided between the (i-d+1)th row and the i-th row electrically continuous to thereby make the current supply lines La of the (i-d+1)th to i-th rows electrically continuous to one another. Then, a potential of the low level L is applied to these current supply lines La. Further, when the scan signal voltage of the on level ON is applied to the gate line Lg of the i-th row, a switch signal voltage of the off level OFF is applied to the control lines Ls of the (1-d)th and i-th rows to switch off the switch transistors Tr14 of the (i-d)th and i-th rows. Therefore, the current supply lines La of the (i-d+1)th to i-th rows are electrically discontinuous from the current supply lines La of the other rows. Further, when the san signal voltage of the on level ON is applied to the gate line Lg of the i-th row, a switch signal voltage of the on level ON is applied to the control lines Ls of the first to (i-d-1)th rows and to the control lines Ls of the (i+1)th to (n-1)th rows to switch on the switch transistors Tr14 of the first to (1-d-1)th rows and the switch transistors Tr14 of the (i+1)th to (n-1)th rows. Therefore, the current supply lines La of the first to (i-d)th rows become electrically continuous to one another, and a potential of the high level H is applied to these current supply lines La. Likewise, the current supply lines La of the (i+1)th to n-th rows become electrically continuous to one another, and a potential of the high level H is applied to these current supply lines La.

In this manner, while the scan signal voltage of the on level ON is applied to the gate line Lg of the i-th row, "d" current supply lines La of the (i-d+1)th to i-th rows are connected to one another to make it possible to suppress a decrease of the potential of the low level L that is applied during the group writing voltage period $T_{WR}$. Further, the current supply lines La of the first to (i-d)th rows become electrically continuous to one another to make it possible to suppress a decrease of the potential of the high level H, and the current supply lines La of the (i+1)th to n-th rows become electrically continuous to one another to make it possible to suppress a decrease of the potential of the high level H.

Embodiment 5

Figure 27:
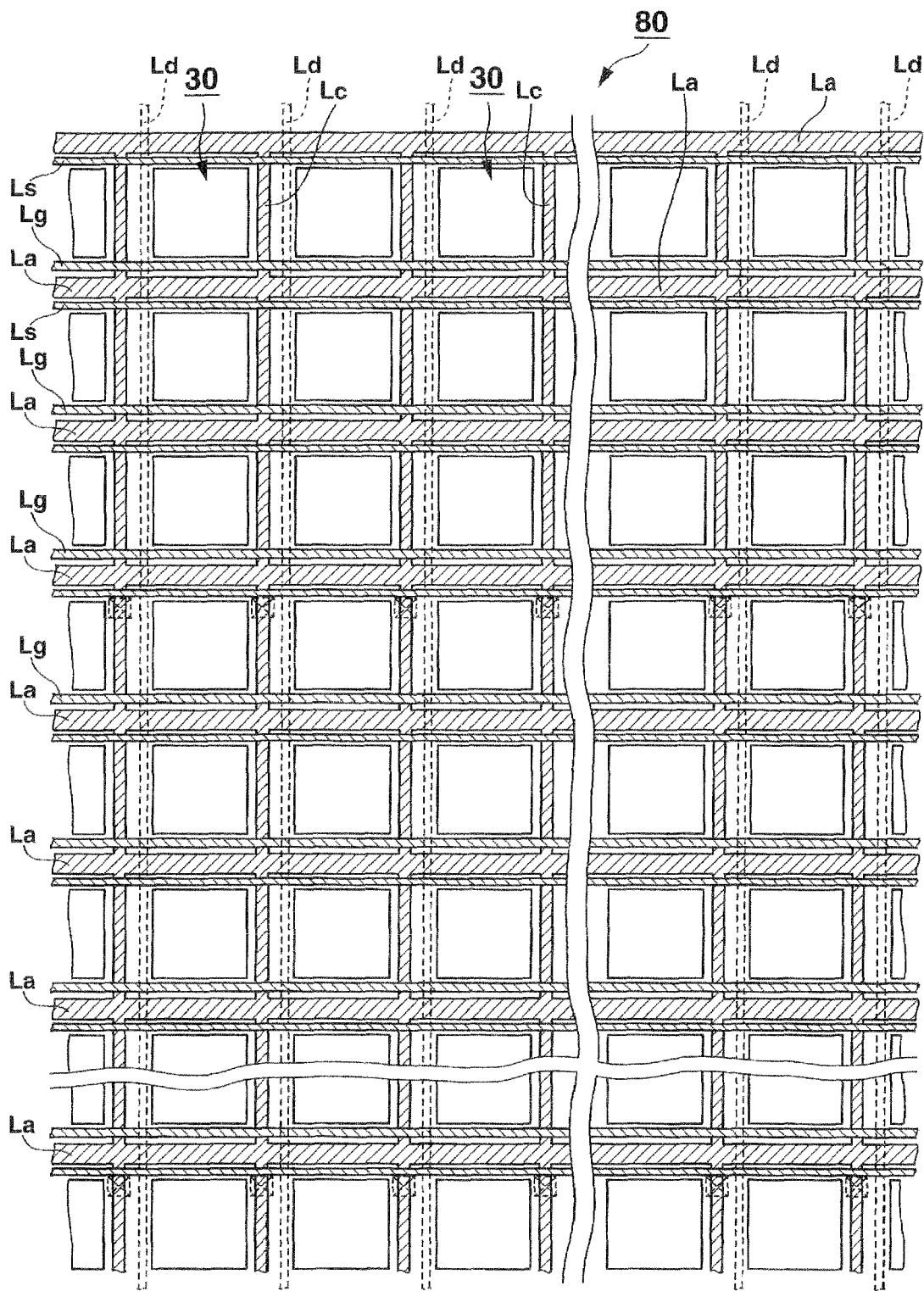
FIG. 27 is a plan view showing an example configuration of a luminescence device according to an embodiment 5.
Figure 28:
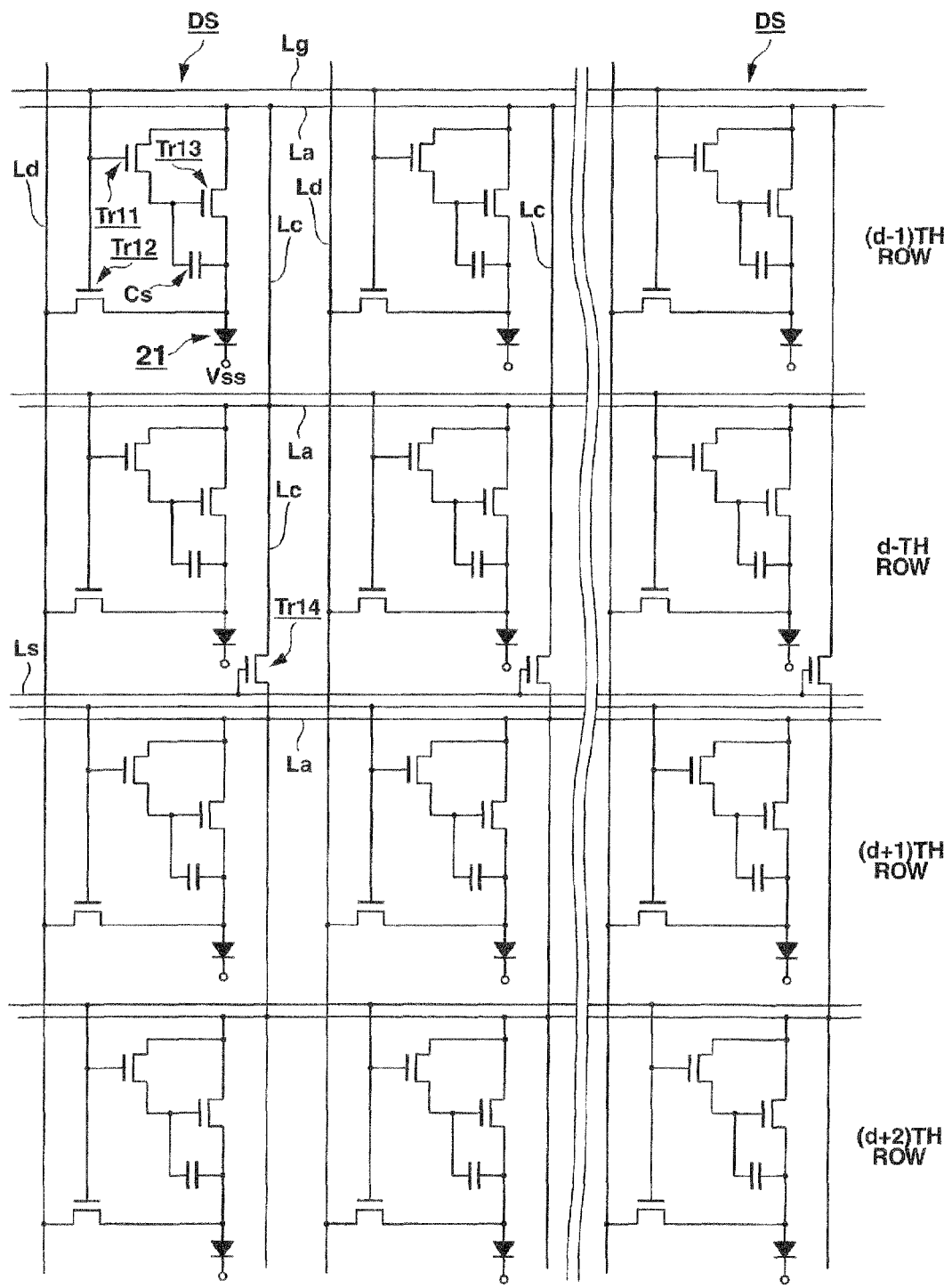
FIG. 28 is an equivalent circuit diagram showing a drive circuit of a pixel.
Figure 29:
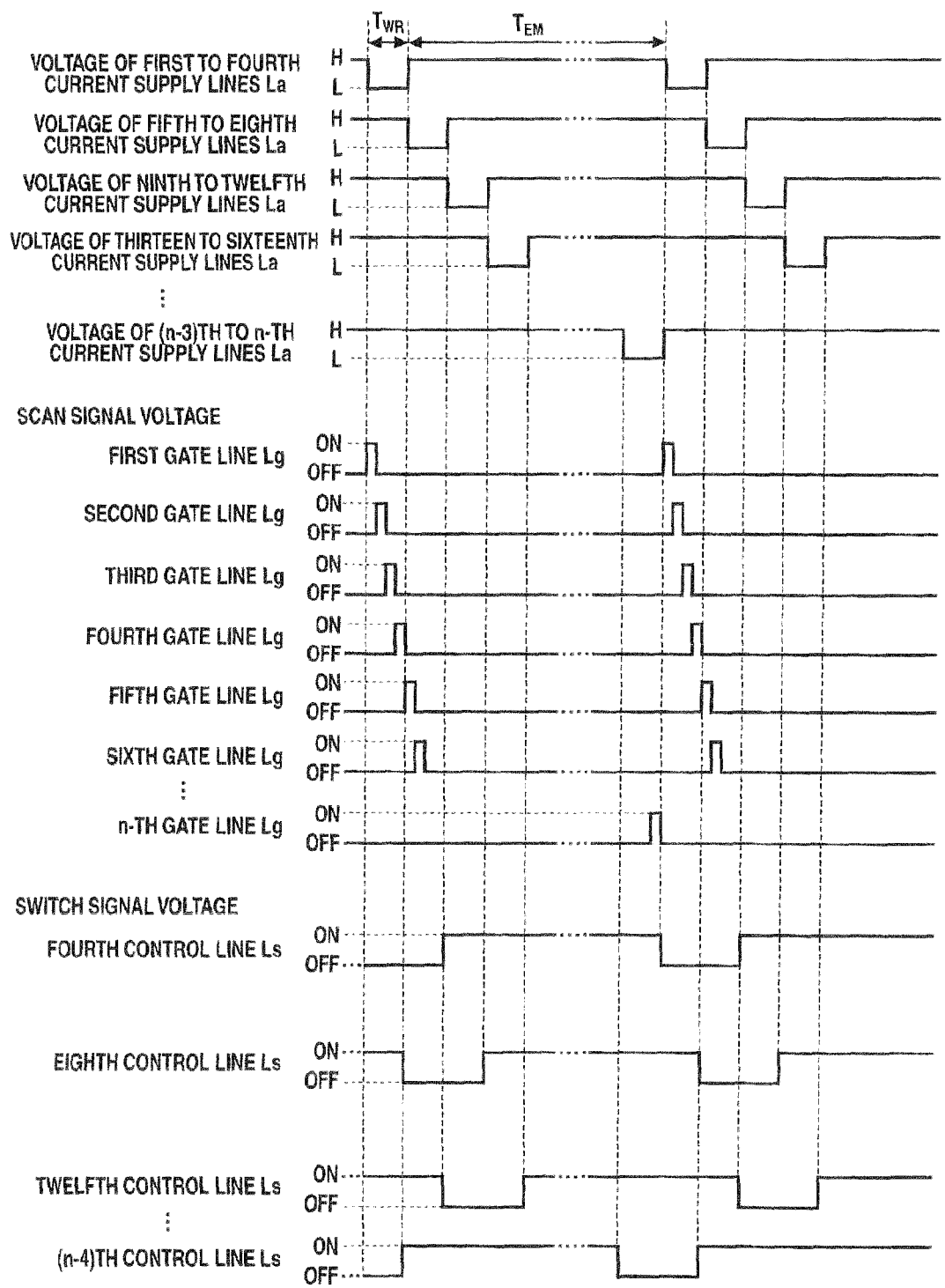
FIG. 29 is a timing chart showing an operation.

A luminescence device 80 according to the embodiment 5 will be explained with reference to FIG. 27 to FIG. 29. In the embodiment 5, as a switching element, one switch transistor Tr14 is provided for each "d" rows on the column-direction connecting line Lc (where "d" is an integer equal to or greater than 2). That is, one switch transistor Tr14 is provided for each column-direction connecting line Lc that is between the pixel 30 of the (p×d)th row (where "p" is a positive integer) and the pixel 30 of the (p×d+1)th row, specifically, the column-direction connecting line Lc between the pixel 30 of the d-th row and the pixel 30 of the (d+1)th row, the column-direction connecting line Lc between the pixel 30 of the 2d-th row and the pixel 30 of the (2d+1)th row, the column-direction connecting line Lc between the pixel 30 of the 3d-th row and the pixel 30 of the (3d+1)th row .... The source and drain electrodes of each switch transistor Tr14 are connected to the column-direction connecting lines Lc that exist upward and downward respectively. Therefore, each switch transistor Tr14 controls electrical continuity or electrical discontinuity between the current supply line La of the (p×d)th row and the current supply line La of the (p×d+1)th row (where "p" is a positive integer). FIG. 27 to FIG. 29 are diagrams of an example where d=4. The current supply lines La are connected in the column direction via the column-direction connecting lines Lc and the switch transistors Tr14. Any members that are the same as those of the embodiments described above will be denoted by the same reference numerals as those members and will not be explained in detail.

As shown in FIG. 29, the current supply driver that is connected to the current supply lines La applies a voltage of the same level to the current supply lines La of each "d" rows. That is, the current supply driver outputs a low level voltage L to the current supply lines La of each "d" rows in their group writing voltage period $T_{WR}$, and then a high level voltage H to them in their group emission voltage period $T_{EM}$. The group writing voltage period $T_{WR}$ shifts from one unit group of the {(p-1)×d+1} to (p×d)th rows to the next such unit group, specifically, from the group of the first to d-th rows to the group of the (d+1)th to 2d-th rows, to the group of the (2d+1)th to 3d-th rows, ... and to the group of (n-d+1)th to n-th rows sequentially.

Each control line Ls is connected to the power supply or a control line driver. The power supply or the control line driver outputs a switch signal voltage of an off level OFF to the control line Ls that is connected to the gate electrode of the switch transistor Tr14 provided for the column-direction connecting line Lc between the current supply line La of the (p×d)th row and the current supply line La of the (p×d+1)th row in the group writing voltage period T of the current supply lines La of the {(p−1)×d+1} to (p×d)th rows and in the group writing voltage period $T_{WR}$ of the next group of current supply lines La of the (p×d+1)th to {(p+1)×d}th rows. The power supply or the control line driver outputs a switch signal voltage of an on level ON to this control line Ls in the other periods than those above.

When a switch signal voltage of the on level ON is applied to the control line Ls of the (p×d)th row, the current supply line La of the (p×d)th row and the current supply line La of the (p×d+1)th row become electrically continuous. When a switch signal voltage of the off level OFF is applied to the control line Ls of the (p×d)th row, the current supply line La of the (p×d)th row and the current supply line La of the (p×d+1)th row become electrically discontinuous.

Therefore, the current supply lines La of the {(p−1)×d+1}th to (p×d)t'n rows become electrically discontinuous from the next group of current supply lines La of the (p×d+1)th to {(p+1)×d}th rows in the group writing voltage period $T_{WR}$ of the current supply lines La of the {(p−1)×d+}th to (p×d)th rows and in the group writing voltage period $T_{WR}$ of the current supply lines La of the (p×d+1)th to {(p+1)×d}th rows. Hence, the current supply lines La of the {(p−1)×d+1} to to (p×d)th rows and the current supply lines La of the (p×d+1)th to {(p+1)×d}th rows can be kept at the low level voltage L and the high level voltage H respectively in the group writing voltage period $T_{WR}$ of the current supply lines La of the {(p−1)×d+1}th to (p×d)th rows, and at the high level voltage H and the low level voltage L respectively in the group writing voltage period $T_{WR}$ of the current supply lines La of the (p×d+1)th to {(p+1)×d}th rows.

When paying attention to the current supply lines La of the (p×d+1)th to {(p+1)×d}th rows, the switch transistor Tr14 of the (p×d)th row is switched off such that voltages of different levels are applied to their preceding group of current supply lines La of the {(p−1)×d+1}th to (p×d)th row and to them in the group writing voltage period $T_{WR}$ of the preceding group of current supply lines La of the {(p−1)×d+1}th to (p×d)th rows and in the group writing voltage period $T_{WR}$ of themselves, i.e., the current supply lines La of the (p×d+1)th to {(p+1)×d}th rows, and the switch transistor Tr14 of the {(p+1)×d}th row is switched off such that voltages of different levels are applied to them and to their succeeding group of current supply lines La of the {(p+1)×d+1}th to {(p+2)×d}th rows in the group writing voltage period $T_{WR}$ of themselves, i.e., the current supply lines La of the (p×d+1)th to the {(p+1)×d}th rows and in the group writing voltage period $T_{WR}$ of the succeeding group of current supply lines La of the {(p+1)×d+1}th to {(p+2)×d}th rows.

In other words, it is possible to lower the resistance of the current supply lines La by switching off the switch transistor Tr14 between adjoining groups of current supply lines La to make them electrically discontinuous if both the groups are at different potentials, or by switching on the switch transistor Tr14 between adjoining groups of current supply lines La to make them electrically continuous if both the groups are at the same potential.

The present invention is not limited to the embodiments described above but may be modified or applied in various manners.

For example, in the embodiment 1 described above, the conductive layer 48 is formed to cover each current supply line La entirely and formed on the drain electrode 13*d* of the luminescence driving transistor Tr13. Not being limited to this, the conductive layer 48 may be formed dividedly on each current supply lines La pixel by pixel or may be formed to cover only the drain electrode 13*d*.

In the embodiment 2 described above, the column-direction connecting line Lc is formed to extend in the column direction to be aligned with the drain electrode 13*d* of the luminescence driving transistor Tr13, but may also be formed on the current supply line La, as the conductive layer 48 of the embodiment 1 described above is.

Figure 30:
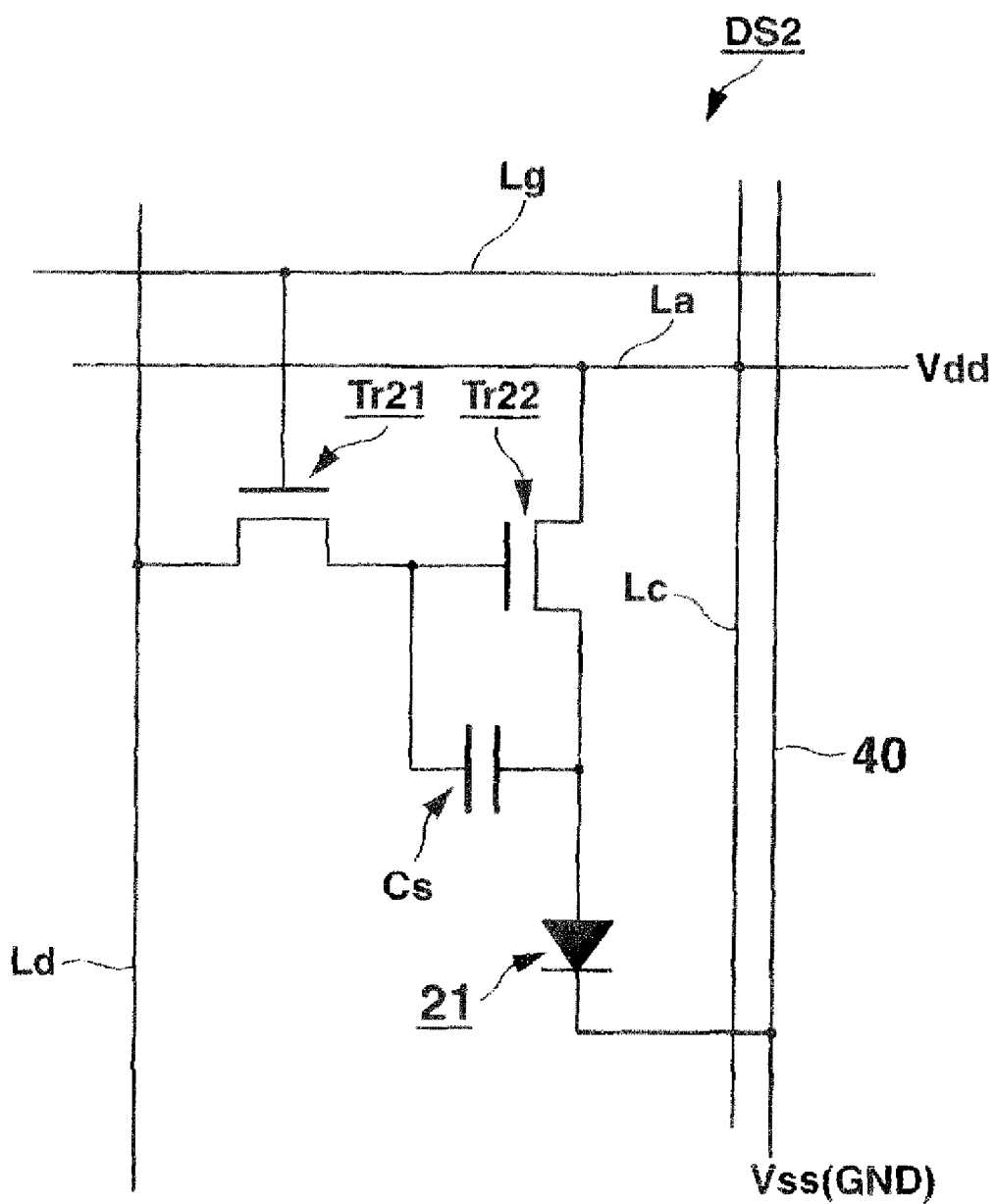
FIG. 30 is a diagram showing a modification example.

In the embodiments described above, the pixel circuit DS includes the total of three transistors, namely the first selector transistor Tr11, the second selector transistor Tr12, and the luminescence driving transistor Tr13. Not being limited to this, the pixel circuit DS may be a pixel circuit DS2 shown in FIG. 30, which includes two transistors, namely a selector transistor Tr21 and a luminescence driving transistor Tr22.

In the embodiments described above, the organic EL elements of a bottom emission type have mainly been explained. Not being limited to this, the present invention may also be applied to organic EL elements of a top emission type that emit display light of the organic EL elements 21 to the outside through the opposing electrode 40.

In the embodiments described above, the luminescence device has been a display device. However, the present invention may also be applied to a printer head that irradiates light to the photoconductive drum of the printer.

In the embodiments described above, each organic EL element includes the positive hole injecting layer 36, the interlayer 37, and the luminescence layer 38. However, the combination of carrier transporting layers is not limited to this, but may be, for example, of a dual-layered structure that includes only the positive hole injecting layer 36 and the luminescence layer 38, a single-layered structure in which the luminescence layer functions also as the positive hole injecting layer, or a structure that includes four or more carrier transporting layers one of which is the luminescence layer.

In the embodiments described above, the organic EL elements 21 have been used. However, other types of luminescence elements such as LEDs may also be used.

The embodiments described above may be combined in an arbitrary manner as long as they are compatible.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2008-243367 filed on Sep. 22, 2008 and Japanese Patent Application No. 2009-157185 filed on Jul. 1, 2009, both including specification, claims, drawings and summary. The disclosures of the above Japanese Patent Applications are incorporated herein by reference in their entirety.

What is claimed is:

1. A luminescence device, comprising:
a plurality of pixels that are arranged in a row direction and a column direction, each pixel including a luminescence element and a luminescence driving transistor connected to the luminescence element, the luminescence element including a first electrode, at least one or more carrier transporting layer(s) formed above the first electrode, and a second electrode formed above the carrier transporting layer(s);

a plurality of current supply lines that are each connected to at least two or more of the pixels that are arranged in the row direction;

a column-direction connecting line that electrically connects the current supply lines that adjoin each other in the column direction to each other; and a switch that controls electrical continuity and electrical discontinuity of the column-direction connecting line in the column direction.

2. A method of driving a luminescence device, the luminescence device including:

a plurality of pixels that are arranged in a row direction and a column direction, each pixel including a luminescence element and a luminescence driving transistor connected to the luminescence element, the luminescence element including a first electrode, at least one or more carrier transporting layer(s) formed above the first electrode, and a second electrode formed above the carrier transporting layer(s);

a plurality of current supply lines that are each connected to at least two or more of the pixels that are arranged in the row direction;

a plurality of column-direction connecting lines that each electrically connect the current supply lines that adjoin each other in the column direction to each other; and a plurality of switches that control electrical continuity and electrical discontinuity of the column-direction connecting lines in the column direction, the method comprising switching off at least one of the plurality of switches to make at least two of the current supply lines that adjoin each other in the column direction via the switched-off switch electrically discontinuous from each other.

3. The method of driving the luminescence device according to claim 2, comprising:

switching off arbitrary two of the plurality of switches to make the current supply lines that correspond to the pixels existing between the two switches electrically discontinuous from the current supply lines that correspond to the other pixels; and applying a first voltage to the current supply lines that correspond to the pixels existing between the two switches and applying a second voltage different from the first voltage to the current supply lines that correspond to the other pixels.

4. The method of driving the luminescence device according to claim 3, wherein each of the plurality of pixels further includes a selector transistor, the plurality of switches are provided for different rows respectively, and the method comprises:

turning on the selector transistors of the pixels on a given row and applying the first voltage to the current supply line of that row; and applying the second voltage to the current supply line of that row in an emission period in which the luminescence elements of the pixels on that row are driven to emit light.

5. The method of driving the luminescence device according to claim 4, comprising:

switching off the switch provided for that row when applying the first voltage to the current supply line of that row;

switching on the switch provided for that row when turning on the selector transistors of the pixels on a row next to that row; and switching off the switch provided for that row when modulating a voltage applied to the current supply line of that row from the first voltage to the second voltage.

6. The method of driving the luminescence device according to claim 2, wherein the plurality of switches are provided for different groups of "d" rows respectively such that one switch is provided for "d" rows, where "d" is an integer equal to or greater than 2.

7. The method of driving the luminescence device according to claim 6, wherein a voltage of a same potential is applied to the current supply lines of each $\{(p-1) \times d+1\}$th to $(p \times d)$th rows, among the plurality of current supply lines, where "p" is a positive integer.

8. The method of driving, the luminescence device according to claim 7, wherein each of the plurality of pixels further includes a selector transistor, and the method comprises controlling each such switch, among the plurality of switches, that is provided for the column-direction connecting line between the current supply line of a $(p \times d)$th row and the current supply line of a $(p \times d+1)$th row, in a manner that the switch makes the current supply line of the $(p \times d)$th row and the current supply line of the $(p \times d+1)$th row electrically discontinuous from each other in scan periods of the selector transistors of the respective pixels on a $\{(p-1) \times d+1\}$th to the $(p \times d)$th rows and in scan periods of the selector transistors of the respective pixels on the $(p \times d+1)$th to a $\{(p+1) \times d\}$th rows, and in a manner that the switch makes the current supply line of the $(p \times d)$th row and the current supply line of the $(p \times d+1)$th row electrically continuous to each other in the other periods than those scan periods.

* * * * *